US009299848B2

(12) United States Patent
Kato

(10) Patent No.: US 9,299,848 B2
(45) Date of Patent: Mar. 29, 2016

(54) SEMICONDUCTOR DEVICE, RF TAG, AND ELECTRONIC DEVICE

(71) Applicant: Semiconductor Energy Laboratory Co., Ltd., Atsugi-shi, Kanagawa-ken (JP)

(72) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/645,547

(22) Filed: Mar. 12, 2015

(65) Prior Publication Data

US 2015/0263006 A1   Sep. 17, 2015

(30) Foreign Application Priority Data

Mar. 14, 2014  (JP) ................................. 2014-052211

(51) Int. Cl.
*H01L 29/786*   (2006.01)
*H01L 27/12*   (2006.01)
*H01L 27/115*   (2006.01)

(52) U.S. Cl.
CPC ...... *H01L 29/78648* (2013.01); *H01L 27/1156* (2013.01); *H01L 27/11551* (2013.01); *H01L 27/1225* (2013.01); *H01L 29/7869* (2013.01); *H01L 29/78651* (2013.01)

(58) Field of Classification Search
CPC ................................................ H01L 29/78648
See application file for complete search history.

(56) References Cited

U.S. PATENT DOCUMENTS 3,585,415 A * 6/1971 Muller ...................... G01L 1/16
                                                              257/254
4,902,637 A    2/1990 Kondou et al.
(Continued)

FOREIGN PATENT DOCUMENTS

EP        1737044 A     12/2006
EP        2226847 A      9/2010
(Continued)

OTHER PUBLICATIONS

Fortunato.E et al., "Wide-Bandgap High-Mobility ZNO Thin-Film Transistors Produced At Room Temperature,", Appl. Phys. Lett. (Applied Physics Letters) , Sep. 27, 2004, vol. 85, No. 13, pp. 2541-2543.
(Continued)

*Primary Examiner* — Anthony Ho
*Assistant Examiner* — Samuel Lair
(74) *Attorney, Agent, or Firm* — Fish & Richardson P.C.

(57) ABSTRACT

A semiconductor device with a reduced area is provided. The semiconductor device includes a first transistor and a second transistor. The first transistor includes a first conductor and a second conductor arranged with a distance therebetween, a first insulator over the first conductor and the second conductor, a semiconductor over the first insulator, a second insulator over the semiconductor, a third conductor over the second insulator, and a fourth conductor and a fifth conductor that are in contact with the semiconductor. The first conductor includes a region not overlapping with the third conductor with the semiconductor therebetween, the first conductor includes a region overlapping with the second conductor with the semiconductor therebetween, and one of a source electrode and a drain electrode of the second transistor is electrically connected to the third conductor of the first transistor.

20 Claims, 19 Drawing Sheets

(56) References Cited

U.S. PATENT DOCUMENTS

| | | | |
|---|---|---|---|
| 4,968,638 A * | 11/1990 | Wright | H01L 29/66969 148/DIG. 106 |
| 5,027,177 A * | 6/1991 | Vasudev | H01L 27/1443 257/131 |
| 5,124,769 A * | 6/1992 | Tanaka | H01L 29/7831 257/366 |
| 5,446,304 A * | 8/1995 | Sameshima | H01L 27/092 257/347 |
| 5,693,549 A * | 12/1997 | Kim | H01L 29/6675 257/66 |
| 5,731,856 A | 3/1998 | Kim et al. | |
| 5,744,864 A | 4/1998 | Cillessen et al. | |
| 5,812,231 A | 9/1998 | Kochi et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,989,569 B1 | 1/2006 | Hiramoto et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,389,417 B2 | 3/2013 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296567 A1 | 12/2008 | Irving et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0114918 A1 | 5/2009 | Wang et al. | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0295042 A1 | 11/2010 | Yano et al. | |
| 2011/0089417 A1 | 4/2011 | Yamazaki et al. | |
| 2011/0101351 A1 | 5/2011 | Yamazaki | |
| 2011/0156025 A1 | 6/2011 | Shionoiri et al. | |
| 2012/0033488 A1 | 2/2012 | Nagatsuka et al. | |
| 2012/0161220 A1 | 6/2012 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-256400 | 12/2012 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLE Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using Igzo Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc.Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD D9 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure For Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; Fe, Ga, Or Al; B: Mg, Mn, Fe, Ni, Cu, Or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev.Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4,.2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings Of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol.220, pp. 567-570.

Lany.S et al., "Dopability, Intrinsic Conductivity, and Nonstoichiometry of Transparent Conducting Oxides,", Phys. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800- 803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered A1203 Gate Insulator,", Appl. Phys. Lett. (Applied Physics Letters) , Sep. 1, 2003, vol. 83, No. 9, pp. 1755-1757. Eng.

* cited by examiner

FIG. 11A
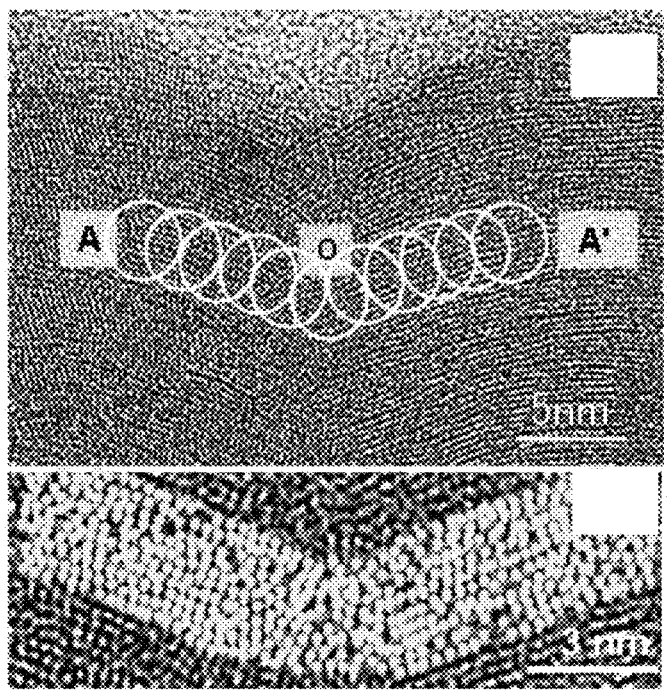
FIG. 11B
FIG. 11C
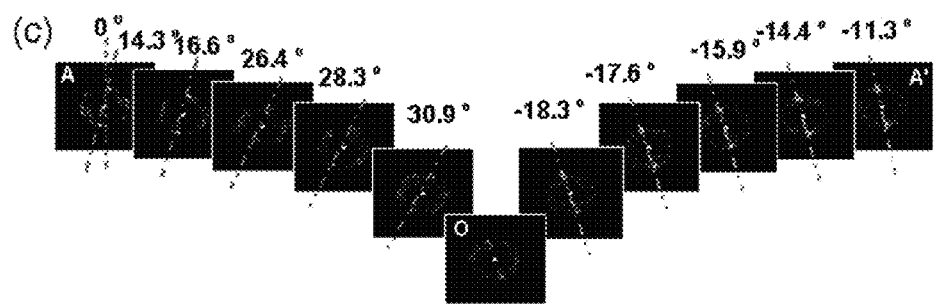

CAAC-OS nc-OS

□ proportion of non-CAAC    ☰ proportion of CAAC as-sputtered after heat treatment at 450 °C

SEMICONDUCTOR DEVICE, RF TAG, AND ELECTRONIC DEVICE

BACKGROUND OF THE INVENTION

1. Field of the Invention

The present invention relates to an object, a method, or a manufacturing method. Furthermore, the present invention relates to a process, a machine, manufacture, or a composition of matter. In particular, the present invention relates to, for example, a semiconductor, a semiconductor device, a display device, a light-emitting device, a lighting device, a power storage device, a memory device, or a processor. Moreover, the present invention relates to a manufacturing method of a semiconductor, a semiconductor device, a display device, a light-emitting device, a lighting device, a power storage device, a memory device, or a processor. The present invention relates to a driving method of a semiconductor device, a display device, a light-emitting device, a lighting device, a power storage device, a memory device, or a processor.

In this specification and the like, a semiconductor device generally means a device that can function by utilizing semiconductor characteristics. A memory device, a display device, a light-emitting device, a lighting device, an electro-optical device, a semiconductor circuit, an electronic device, and the like include a semiconductor device in some cases.

2. Description of the Related Art

Much attention is focused on a semiconductor device that retains data even after interruption of power supply by using a combination of a transistor including semiconductor silicon (Si) in its channel formation region (this transistor is referred to as a Si transistor in the following description) and a transistor including an oxide semiconductor (preferably an oxide including In, Ga, and Zn) in its channel formation region (see Patent Document 1).

In recent years, with the increase in the amount of data manipulated, a semiconductor device having a large storage capacity has been required. In such situations, the semiconductor device disclosed in Patent Document 1 has a structure in which multilevel data is stored and read.

REFERENCE

Patent Document

[Patent Document 1] Japanese Published Patent Application No. 2012-256400

SUMMARY OF THE INVENTION

An object of one embodiment of the present invention is at least one of the following: providing a semiconductor device (memory cell) with reduced area, providing a semiconductor device with improved storage density, providing a semiconductor device with improved storage capacity, providing a miniaturized semiconductor device, and providing a novel semiconductor device.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

(1) One embodiment of the present invention is a semiconductor device which includes a first transistor and a second transistor. In the semiconductor device, the first transistor includes a first conductor, a second conductor, a first insulator over the first conductor and the second conductor, a semiconductor over the first insulator, a second insulator over the semiconductor, a third conductor over the second insulator, and a fourth conductor and a fifth conductor that are in contact with the semiconductor. The semiconductor includes a first region, when seen from the above, not overlapping with the fourth conductor, not overlapping with the fifth conductor, and overlapping with the first conductor; a second region, when seen from the above, not overlapping with the fourth conductor, not overlapping with the fifth conductor, and overlapping with the second conductor; and a third region, when seen from the above, not overlapping with the fourth conductor, not overlapping with the fifth conductor, and overlapping with the third conductor. The first region includes a region not overlapping with the third region, the second region includes a region overlapping with the third region, and one of a source electrode and a drain electrode of the second transistor is electrically connected to the third conductor of the first transistor.

(2) Another embodiment of the present invention is a semiconductor device which includes a first memory cell and a second memory cell adjacent to each other. In the semiconductor device, the first memory cell and the second memory cell each include a first transistor and a second transistor. The first transistor includes a first conductor, a second conductor, a first insulator over the first conductor and the second conductor, a semiconductor over the first insulator, a second insulator over the semiconductor, a third conductor over the second insulator, and a fourth conductor and a fifth conductor that are in contact with the semiconductor. The semiconductor includes a first region, when seen from the above, not overlapping with the fourth conductor, not overlapping with the fifth conductor, and overlapping with the first conductor; a second region, when seen from the above, not overlapping with the fourth conductor, not overlapping with the fifth conductor, and overlapping with the second conductor; and a third region, when seen from the above, not overlapping with the fourth conductor, not overlapping with the fifth conductor, and overlapping with the third conductor. The first region includes a region not overlapping with the third region, the second region includes a region overlapping with the third region, one of a source electrode and a drain electrode of the second transistor is electrically connected to the third conductor of the first transistor, and the first conductor included in the first memory cell is electrically connected to the first conductor included in the second memory cell.

(3) Another embodiment of the present invention is a semiconductor device which includes a first memory cell and a second memory cell adjacent to each other. In the semiconductor device, the first memory cell and the second memory cell each include a first transistor and a second transistor. The first transistor includes a first conductor, a second conductor, a first insulator over the first conductor and the second conductor, a semiconductor over the first insulator, a second insulator over the semiconductor, a third conductor over the second insulator, and a fourth conductor and a fifth conductor that are in contact with the semiconductor. The semiconductor includes a first region, when seen from the above, not overlapping with the fourth conductor, not overlapping with the fifth conductor, and overlapping with the first conductor; a second region, when seen from the above, not overlapping with the fourth conductor, not overlapping with the fifth conductor, and overlapping with the second conductor; and a third region, when seen from the above, not overlapping with the fourth conductor, not overlapping with the fifth conductor, and overlapping with the third conductor. The first region includes a region not overlapping with the third region, the second region includes a region overlapping with the third region, one of a source electrode and a drain electrode of the second transistor is electrically connected to the third conductor of the first transistor, and the second conductor included in the first memory cell is electrically connected to the second conductor included in the second memory cell.

(4) Another embodiment of the present invention is the semiconductor device according to any one of the embodiments (1) to (3), in which the second region is included in the third region.

(5) Another embodiment of the present invention is the semiconductor device according to any one of the embodiments (1) to (3), in which the first region and the third region do not overlap with each other and a distance between the first region and the third region is shorter than or equal to a distance between the first region and the second region.

(6) Another embodiment of the present invention is the semiconductor device according to any one of the embodiments (1) to (3), in which the first region and the third region overlap with each other and a width of a region where the first region and the third region overlap with each other is shorter than or equal to a distance between the first region and the second region.

(7) Another embodiment of the present invention is the semiconductor device according to any one of the embodiments (1) to (3), in which an edge of the first region is aligned with an edge of the third region.

(8) Another embodiment of the present invention is a semiconductor device which includes a first transistor and a second transistor. In the semiconductor device, the first transistor includes a first conductor and a second conductor arranged with a distance therebetween, a first insulator over the first conductor and the second conductor, a semiconductor over the first insulator, a second insulator over the semiconductor, a third conductor over the second insulator, and a fourth conductor and a fifth conductor that are in contact with the semiconductor. The first conductor includes a region not overlapping with the third conductor with the semiconductor therebetween, the second conductor includes a region overlapping with the third conductor with the semiconductor therebetween, and one of a source electrode and a drain electrode of the second transistor is electrically connected to the third conductor of the first transistor.

(9) Another embodiment of the present invention is a semiconductor device which includes a first memory cell and a second memory cell adjacent to each other. In the semiconductor device, the first memory cell and the second memory cell each include a first transistor and a second transistor. The first transistor includes a first conductor and a second conductor arranged with a distance therebetween, a first insulator over the first conductor and the second conductor, a semiconductor over the first insulator, a second insulator over the semiconductor, a third conductor over the second insulator, and a fourth conductor and a fifth conductor that are in contact with the semiconductor. The first conductor includes a region not overlapping with the third conductor with the semiconductor therebetween, the second conductor includes a region overlapping with the third conductor with the semiconductor therebetween, one of a source electrode and a drain electrode of the second transistor is electrically connected to the third conductor of the first transistor, and the first conductor included in the first memory cell is electrically connected to the first conductor included in the second memory cell.

(10) Another embodiment of the present invention is a semiconductor device which includes a first memory cell and a second memory cell adjacent to each other. In the semiconductor device, the first memory cell and the second memory cell each include a first transistor and a second transistor. The first transistor includes a first conductor and a second conductor arranged with a distance therebetween, a first insulator over the first conductor and the second conductor, a semiconductor over the first insulator, a second insulator over the semiconductor, a third conductor over the second insulator, and a fourth conductor and a fifth conductor that are in contact with the semiconductor. The first conductor includes a region not overlapping with the third conductor with the semiconductor therebetween, the second conductor includes a region overlapping with the third conductor with the semiconductor therebetween, one of a source electrode and a drain electrode of the second transistor is electrically connected to the third conductor of the first transistor, and the second conductor included in the first memory cell is electrically connected to the second conductor included in the second memory cell.

(11) Another embodiment of the present invention is the semiconductor device according to any one of the embodiments (8) to (10), in which the third conductor includes a region that does not overlap with the second conductor with the semiconductor therebetween.

(12) Another embodiment of the present invention is the semiconductor device according to any one of the embodiments (8) to (10), in which the first conductor and the third conductor do not overlap with each other with the semiconductor therebetween and, when seen from the above, a distance between the first conductor and the third conductor is shorter than or equal to a distance between the first conductor and the second conductor.

(13) Another embodiment of the present invention is the semiconductor device according to any one of the embodiments (8) to (10), in which the first conductor and the third conductor overlap with each other with the semiconductor therebetween and, when seen from the above, a width of a region where the first conductor and the third conductor overlap with each other is shorter than or equal to a distance between the first conductor and the second conductor.

(14) Another embodiment of the present invention is the semiconductor device according to any one of the embodiments (1) to (13), in which the semiconductor included in the first transistor is an oxide semiconductor and a channel formation region of the second transistor includes an oxide semiconductor.

(15) Another embodiment of the present invention is the semiconductor device according to any one of the embodiments (1) to (14), in which the second transistor is stacked over the first transistor.

(16) Another embodiment of the present invention is the semiconductor device according to any one of the embodiments (1) to (14), in which any one state of 4 to 256 levels is held by the first transistor and the second transistor.

(17) Another embodiment of the present invention is an RF tag (radio-frequency tag) which includes the semiconductor device according to any one of the embodiments (1) to (16) and an antenna.

(18) Another embodiment of the present invention is an electronic device which includes the semiconductor device according to any one of the embodiments (1) to (16) and a printed wiring board.

A semiconductor device (memory cell) with reduced area can be provided. A semiconductor device with improved storage density can be provided. A semiconductor device with improved storage capacity can be provided. A miniaturized semiconductor device can be provided. A novel semiconductor device can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIGS. 11A and 11B are cross-sectional TEM images of an oxide semiconductor, and FIG. 11C shows local Fourier transform images of the oxide semiconductor;

DETAILED DESCRIPTION OF THE INVENTION

Figure 1:
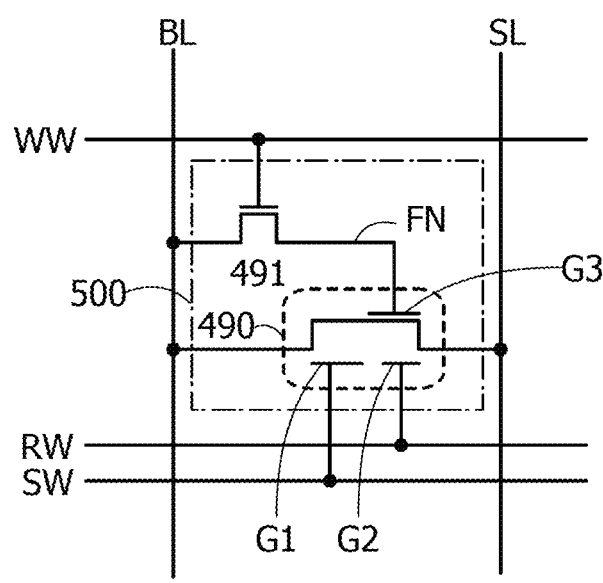
FIG. 1 is a circuit diagram of a semiconductor device (memory cell) of one embodiment of the present invention.

Embodiments of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments described below. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, description can be made even when "first" is replaced with "second" or "third", as appropriate. In addition, the ordinal numbers in this specification and the like are not necessarily the same as the ordinal numbers used to specify one embodiment of the present invention.

Note that a "semiconductor" may have characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" may have characteristics of a "conductor" in some cases when the conductivity is sufficiently high, for example. A "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that in the embodiments described below, an insulator may be formed to have, for example, a single-layer structure or a stacked-layer structure including an insulator containing one or more kinds of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum unless otherwise specified. A resin may be used as the insulator. For example, a resin containing polyimide, polyamide, acrylic, silicone, or the like may be used. The use of a resin does not need planarization treatment performed on a top surface of the insulator in some cases. By using a resin, a thick film can be formed in a short time; thus, the productivity can be increased. The insulator may be preferably formed to have a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

Note that in the following embodiments, unless otherwise specified, a conductor may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In this specification, the phrase "A has a region with a concentration B" means, for example, "the concentration of the entire region of A in the depth direction is B", "the average concentration in a region of A in the depth direction is B", "the median value of the concentration in a region of A in the depth direction is B", "the maximum value of the concentration in a region of A in the depth direction is B", "the minimum value of the concentration in a region of A in the depth direction is B", "a convergence value of the concentration in a region of A in the depth direction is B", and "the concentration in a region in which a probable value of A can be obtained in measurement is B".

In this specification, the phrase "A has a region with a size B, a length B, a thickness B, a width B, or a distance B" means, for example, "the size, the length, the thickness, the width, or the distance of the entire region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region in which a probable value of A can be obtained in measurement is B".

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that in this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "perpendicular" indicates that the angle formed between two straight lines is greater than or equal to $80°$ and less than or equal to $100°$, and accordingly includes the case where the angle is greater than or equal to $85°$ and less than or equal to $95°$.

Note that the layout of circuit blocks in a drawing is the one for specifying the positional relationship in description. Thus, even when a drawing shows that different functions are achieved in different circuit blocks, an actual circuit or region may be configured so that the different functions are achieved in the same circuit block. Furthermore, the function of each circuit block in a drawing is specified for description. Thus, even when one circuit block is illustrated, an actual circuit or region may be configured so that processing which is illustrated as being performed in the one circuit block is performed in a plurality of circuit blocks.

Embodiment 1

In this embodiment, a semiconductor device of one embodiment of the present invention will be described with reference to drawings.

FIG. 1 illustrates an example of a circuit configuration of a semiconductor device of one embodiment of the present invention.

The semiconductor device in FIG. 1 has a function of a memory cell. In the following description, this semiconductor device is referred to as a "semiconductor device (memory cell)" or simply a "memory cell" in some cases.

A semiconductor cell 500 includes a transistor 490 and a transistor 491.

The transistor 490 includes a first gate electrode, a second gate electrode, a third gate electrode, a source electrode, and a drain electrode. A channel formation region is positioned between the first gate electrode and the third gate electrode and also between the second gate electrode and the third gate electrode. The first gate electrode is positioned so as not to completely overlap with the third gate electrode and thus has a region that does not overlap with the third gate electrode when seen from the above. The second gate electrode and the third gate electrode have a region where they overlap with each other with the channel formation region therebetween. In drawings, the transistor 490 with such a structure is represented by the region surrounded by dotted lines. Furthermore, the first gate electrode, the second gate electrode, and the third gate electrode are represented by G1, G2, and G3, respectively in FIG. 1.

One of a source electrode and a drain electrode of the transistor 491 and the third gate electrode of the transistor 490 are electrically connected to each other. This connected portion is also referred to as a floating node FN.

The memory cell 500 is connected to a write word line WW, a read word line RW, a selection word line SW, a bit line BL, and a source line SL.

A gate electrode of the transistor 491 is connected to the write word line WW. The other of the source electrode and the drain electrode of the transistor 491 is connected to the bit line BL. The first gate electrode and the second gate electrode of the transistor 490 are connected to the selection word line SW and the read word line RW, respectively. One of the source electrode and the drain electrode of the transistor 490 is connected to the source line SL, and the other is connected to the bit line BL. Note that the bit line connected to the other of the source electrode and the drain electrode of the transistor 491 and the bit line connected to the other of the source electrode and the drain electrode of the transistor 490 may be different bit lines.

The memory cell 500 is a circuit that stores data by holding a potential supplied to the floating node FN. In other words, the memory cell 500 is a circuit that stores data by holding charges accumulated in the floating node FN.

The memory cell 500 can store k-level data by holding k kinds of potentials (charges or states) (k is an integer of two or more) in the floating node FN. For example, the memory cell 500 can store any one of 2-level to 256-level data. For example, the memory cell 500 can store 2-, 4-, 8-, 16-, 32-, 64-, 128-, or 256-level data.

Here, a structure and functions of the transistor 490 will be described.

In the transistor 490, it is preferable that, when seen from the above, the entire region where the second gate electrode overlaps with the channel formation region (or a semiconductor layer) overlap with the third gate electrode. If there is a region not overlapping with the third gate electrode here, when the conduction state of the transistor 490 is controlled by the second gate electrode, the transistor 490 might be unintentionally brought into a non-conducting state; thus, malfunction might be caused.

In the transistor 490, the third gate electrode may include a region that does not overlap with the second gate electrode with the channel formation region therebetween. Even in the case where the third gate electrode has a region that does not overlap with the second gate electrode, operation that does not cause an unintentional non-conducting state of the transistor 490 is possible when the conduction state of the transistor 490 is controlled by the second gate electrode. The region where the third gate electrode does not overlap with the second gate electrode is preferably as small as possible. Furthermore, when seen from the above, an edge of the third gate electrode and an edge of the second gate electrode may be aligned with each other with the channel formation region therebetween.

In the transistor 490, the third gate electrode and the first gate electrode may be arranged with a distance therebetween when seen from the above. However, the distance between the third gate electrode and the first gate electrode is preferably as short as possible because the resistivity of the transistor 490 in a conducting state might become high by the distance. The distance between the third gate electrode and the first gate electrode can be, for example, shorter than or equal to the distance between the first gate electrode and the second gate electrode, preferably shorter than or equal to half the distance between the first gate electrode and the second gate electrode.

In the transistor 490, the first gate electrode may partly overlap with the third gate electrode with the channel formation region therebetween. Even if there is such an overlap, operation that does not cause an unintentional non-conducting state of the transistor 490 is possible when the conduction state of the transistor 490 is controlled by the first gate electrode. The region where the first gate electrode overlaps with the third gate electrode is preferably as small as possible. The width of the region where the first gate electrode overlaps with the third gate electrode can be, for example, shorter than or equal to the distance between the first gate electrode and the second gate electrode and preferably shorter than or equal to half the distance between the first gate electrode and the second gate electrode.

Furthermore, when seen from the above, an edge of the first gate electrode and an edge of the third gate electrode may be aligned with each other with the channel formation region therebetween.

The transistor 490 with the above-described structure is turned on or off depending on the potential of the first gate electrode, the potential of the second gate electrode, and the potential of the third gate electrode. When a voltage Vg1 of the first gate electrode becomes higher than Vth1, the channel formation region of the transistor 490 is controlled by the first gate electrode, so that a channel is formed or carriers are induced in the channel formation region. At this time, the channel formation region of the transistor 490 is not controlled by the third gate electrode. In the case where the voltage of the second gate electrode is Vg2, when a voltage Vg3 of the third gate electrode becomes higher than or equal to a predetermined potential, the channel formation region of the transistor 490 is controlled by the second gate electrode and the third gate electrode, so that a channel is formed or carriers are induced in the channel formation region. This is the case where Vg3>Vth23 (Vg2) is satisfied. Here, Vth23 (Vg2) is a voltage depending on the voltage Vg2 of the second gate electrode. For example, in some cases, Vth23 (Vg2) is expressed as Vth23 (Vg2_0)−c×(Vg2_0−VR_0). This is the formula for expressing Vth23 (Vg2) when Vth23 at the time when the potential of the second gate electrode is Vg2_0 is known and the potential of the second gate electrode is changed to VR_0. The coefficient c is the value obtained by dividing the capacitance per unit area of an insulator between the second gate electrode and the channel formation region by the capacitance per unit area of an insulator between the third gate electrode and the channel formation region. Thus, there are at least two threshold voltages, that is, Vth1 and Vth23 (Vg2), in the transistor 490. Note that Vth1 is the threshold voltage relating to the first gate electrode, and Vth23 (Vg2) is the threshold voltage relating to the second gate electrode and the third gate electrode. Since the channel formation region relating to the first gate electrode and the channel formation region relating to the second gate electrode and the third gate electrode are positioned in series between the source electrode and the drain electrode, the transistor 490 is turned on only when Vg1>Vth1 and Vg3>Vth23 (Vg2) are satisfied.

Note that the voltage Vg1 of the first gate electrode is a difference in potential between the first gate electrode and the source or drain electrode, the voltage Vg2 of the second gate electrode is a difference in potential between the second gate electrode and the source or drain electrode, and the voltage Vg3 of the third gate electrode is a difference in potential between the third gate electrode and the source or drain electrode.

The transistor 490 with the above-described structure may include a channel formation region (also referred to as "channel formation region C") that is controlled by not the second gate electrode but the third gate electrode. When the voltage Vg3 of the third gate electrode becomes higher than or equal to Vth3, a channel is formed or carriers are induced in the channel formation region C. Furthermore, the transistor 490 with the above-described structure may include a channel formation region (also referred to as "channel formation region D") that is controlled by the first gate electrode and the third gate electrode. In the case where the voltage of the first gate electrode is Vg1, when the voltage Vg3 of the third gate electrode becomes higher than or equal to a predetermined potential, a channel is formed or carriers are induced in the channel formation region D. This is the case where Vg3>Vth13 (Vg1) is satisfied. Here, Vth13 (Vg1) is a voltage depending on the voltage Vg1 of the first gate electrode.

In the case where the transistor 490 includes the channel formation region C, when Vg1>Vth1 and Vg3>Vth23 (Vg2) are satisfied, operation voltages are selected so as to satisfy the relation, Vg3>Vth3. Furthermore, in the case where the transistor 490 includes the channel formation region D, when Vg1>Vth1 and Vg3>Vth23 (Vg2) are satisfied, operation voltages are selected so as to satisfy the relation, Vg3>Vth13 (Vg1). That is, the transistor 490 is on when Vg1>Vth1 and Vg3>Vth23 (Vg2) are satisfied and is off in the other cases. As described later, selection of such operation voltages is possible.

In the above-described case, it can be said that the transistor 490 has a function equivalent to that of a circuit in which two transistors, a transistor having the threshold voltage Vth1 (also referred to as a transistor 490_1) and a transistor having the threshold voltage Vth23 (also referred to as a transistor 490_23), are connected in series.

In the memory cell 500, the transistor 491 is a transistor that controls the supply of a potential to the floating node FN. In other words, the transistor 491 is a transistor that stores and releases charges in and from the floating node FN. The transistor 491 is a transistor having a writing function. The transistor 490 turns on or off depending on the potential VF of the floating node FN, the potential VR of the read word line RW, and the potential VS of the selection word line SW. The source or drain electrode of the transistor 490 is brought to have a predetermined potential in accordance with the potential VF of the floating node FN, the potential VR of the read word line RW, and the potential VS of the selection word line SW, in some cases. For example, the source or drain electrode has a potential of VF−Vth23 (VR), in some cases. By the detection of such a state, data held in the memory cell 500 can be read. The transistor 490 is a transistor having a reading function.

A signal that controls the conduction state of the transistor 491 is supplied to the write word line WW. A signal that controls the conduction state of the transistor 490 is supplied to the read word line RW and the selection word line SW. A signal that controls the conduction state of the transistor 490 is supplied to the read word line RW under the influence of the potential of the floating node FN. A signal that controls the conduction state of the transistor 490 is supplied to the selection word line SW under little or no influence of the potential of the floating node FN. Signals that control the potentials of the one and the other of the source electrode and the drain electrode of the transistor 490 are supplied to the source line SL and the bit line BL, respectively. An output signal from the memory cell 500 is supplied to the bit line BL. In this case, data read from the memory cell 500 is supplied to the bit line BL. Alternatively, a potential supplied to the floating node FN when the transistor 491 is on is supplied to the bit line BL. In this case, data written into the memory cell 500 is supplied to the bit line BL.

The transistor 490 may be either of an n-channel type or of a p-channel type. The transistor 491 may be of an n-channel type or a p-channel type.

As the transistor 491, a transistor with a small drain current in an off state (also referred to as a leakage current) can be used. For example, the drain current in an off state is $1 \times 10^{-18}$ A or lower, preferably $1 \times 10^{-21}$ A or lower, further preferably $1 \times 10^{-24}$ A or lower at room temperature (approximately 25° C.), or $1 \times 10^{-15}$ A or lower, preferably $1 \times 10^{-18}$ A or lower, further preferably $1 \times 10^{-21}$ A or lower at 85° C. For example, a transistor including an oxide semiconductor (preferably an oxide including In, Ga, and Zn) in its channel formation region (also referred to as a transistor including an oxide semiconductor in the following description) can be used.

By using a transistor with a small leakage current as the transistor 491, charges accumulated in the floating node FN can be held for a long time. That is, the memory cell 500 has a function of a memory circuit capable of holding data for a long time without supply of power. In other words, the memory cell 500 has a function of a nonvolatile memory circuit.

Transistors with high withstand voltage, that is, transistors with high gate withstand voltage or high drain withstand voltage, can be used as the transistors 490 and 491. For example, transistors including a gate insulator with a thickness of 5 mm or more, preferably 7 nm or more, further preferably 10 nm or more can be used. Transistors including a semiconductor having an energy gap of 2.5 eV or more and 4.2 eV or less, preferably 2.8 eV or more and 3.8 eV or less, further preferably 3 eV or more and 3.5 eV or less in their channel formation regions can be used. For example, transistors including an oxide semiconductor (preferably an oxide including In, Ga, and Zn) in their channel formation regions can be used.

By using transistors with high withstand voltage as the transistors 490 and 491, a higher potential can be held in the floating node FN. The memory cell 500 can store further multilevel states or much more data by holding a wide range of potentials from a low potential to a high potential in the floating node, in which case higher storage density can be achieved. For example, when 32 states can be stored in the floating node FN, the memory cell 500 can store 32-level data.

The transistor 490 and the transistor 491 may be stacked. The transistor 490 and the transistor 491 may be arranged so as to overlap with each other. In such a case, the memory cell 500 can be reduced in size.

An expression "a transistor A and a transistor B overlap with each other" means that at least part of a gate electrode, a drain electrode (or a drain region), or a source electrode (or a source region) of the transistor A overlaps with part of a gate electrode, a drain electrode (or a drain region), or a source electrode (or a source region) of the transistor B. The expression also means that a region including the gate electrode, the drain electrode (or the drain region), or the source electrode (or the source region) of the transistor A at least partly overlaps with a region including the gate electrode, the drain electrode (or the drain region), or the source electrode (or the source region) of the transistor B. Furthermore, the expression also means that a region including any of components of the transistor A at least partly overlaps with a region including any of components of the transistor B.

Next, a memory cell in which the transistor 490 and the transistor 491 are stacked will be described with reference to FIGS. 2A to 2C and FIG. 3.

Note that in FIGS. 2A to 2C and FIG. 3, some components such as an insulator are omitted for easy understanding, and a conductor or the like formed in the same layer are shown with the same hatching pattern.

Figure 2A:
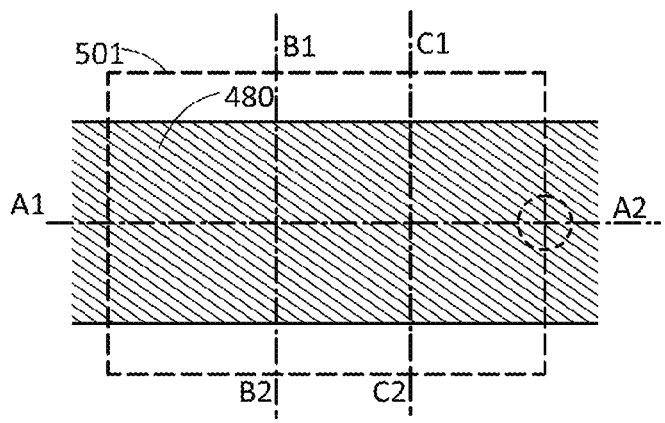
FIGS. 2A to 2C are plan views of a semiconductor device (memory cell) of one embodiment of the present invention.
Figure 2B:
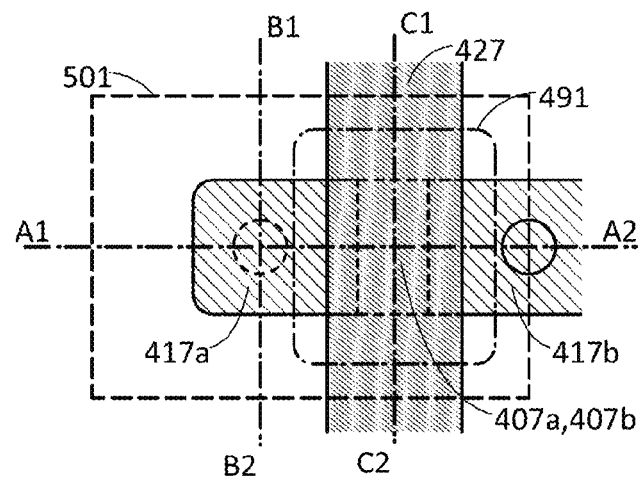
Figure 2C:
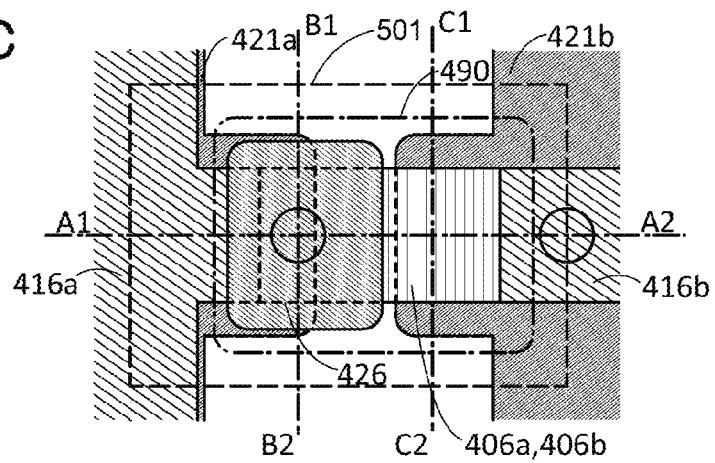

FIGS. 2A to 2C are plan views illustrating an example of the structure of the memory cell 500. FIG. 2A is the plan view of a region including the bit line BL, FIG. 2B is the plan view of a region including the transistor 491, and FIG. 2C is the plan view of a region including the transistor 490. A region 501 is the region occupied by the memory cell 500.

Figure 3:
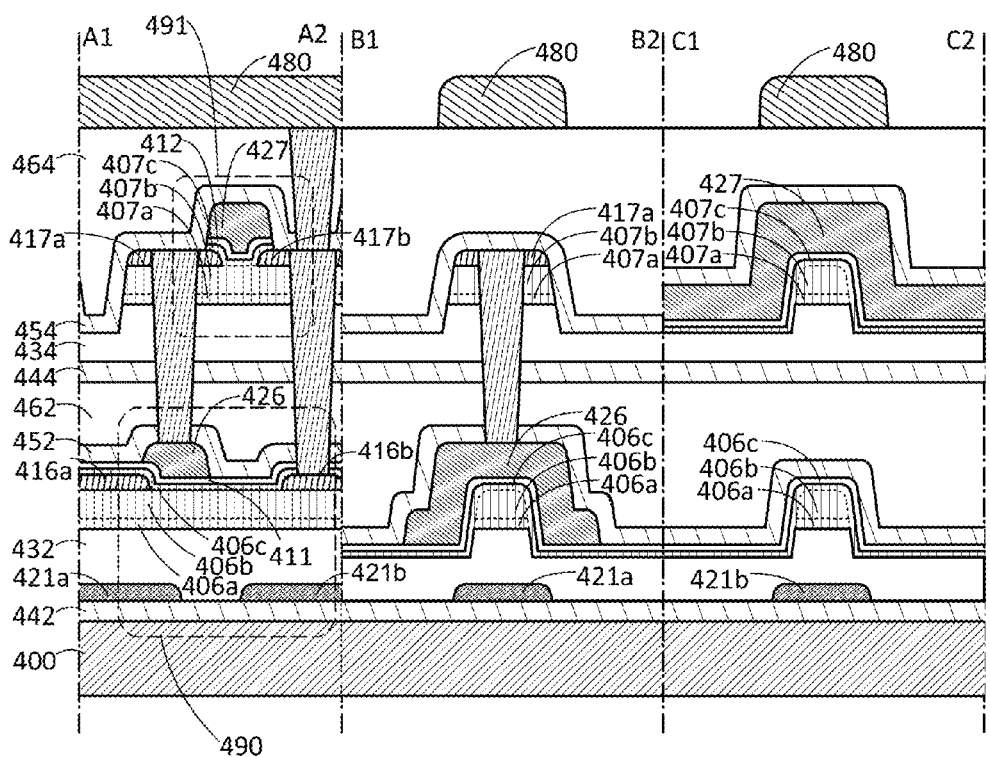
FIG. 3 is a cross-sectional view of a semiconductor device (memory cell) of one embodiment of the present invention.

FIG. 3 is a cross-sectional view illustrating an example of the structure of the memory cell 500. A cross section taken along dashed-dotted line A1-A2 in FIGS. 2A to 2C is shown on the left side of FIG. 3, a cross section taken along dashed-dotted line B1-B2 in FIGS. 2A to 2C is shown in the center in FIG. 3, and a cross section taken along dashed-dotted line C1-C2 in FIGS. 2A to 2C is shown on the right side of FIG. 3.

The memory cell 500 illustrated in FIGS. 2A to 2C and FIG. 3 includes the transistor 490 and the transistor 491 and forms the circuit illustrated in FIG. 1. Here, as an example, description is made on the assumption that the transistor 490 and the transistor 491 are transistors including an oxide semiconductor (preferably an oxide including In, Ga, and Zn) in their channel formation regions.

The memory cell 500 illustrated in FIG. 3 includes a substrate 400, an insulator 442 over the substrate 400, the transistor 490 over the insulator 442, an insulator 444 over the transistor 490, and the transistor 491 over the insulator 444. Note that the insulators 442 and 444 preferably have a function of blocking oxygen and hydrogen.

The substrate 400 may be a semiconductor substrate including a single-material semiconductor of silicon, germanium, or the like or a compound semiconductor of silicon carbide, silicon germanium, gallium arsenide, gallium nitride, indium phosphide, zinc oxide, gallium oxide, or the like, for example. For the semiconductor substrate, an amorphous semiconductor or a crystalline semiconductor may be used, and examples of the crystalline semiconductor include a single crystal semiconductor, a polycrystalline semiconductor, and a microcrystalline semiconductor. Alternatively, the substrate 400 may be a glass substrate. Further alternatively, the substrate 400 may be an element substrate in which a semiconductor element is formed on a semiconductor substrate or a glass substrate.

The transistor 490 includes conductors 421a and 421b, an insulator 432 over the conductors 421a and 421b, semiconductors 406a, 406b, and 406c over the insulator 432, an insulator 411 over the semiconductors, a conductor 426 over the insulator 411, and conductors 416a and 416b connected to the semiconductors.

Specifically, the transistor 490 includes the conductors 421a and 421b, the insulator 432 over the conductors 421a and 421b, the semiconductor 406a over the insulator 432, the semiconductor 406b over the semiconductor 406a, the conductors 416a and 416b in contact with a top surface of the semiconductor 406b, the semiconductor 406c in contact with a side surface of the semiconductor 406a, top and side surfaces of the semiconductor 406b, top and side surfaces of the conductor 416a, and top and side surfaces of the conductor 416b, the insulator 411 over the semiconductor 406c, and the conductor 426 over the insulator 411.

As illustrated in FIG. 3, the conductor 426 electrically surrounds the semiconductor 406b in the channel width direction, that is, surrounds not only the top surface but also the side surfaces of the semiconductor 406b. Such a transistor structure is referred to as a surrounded channel (s-channel) structure. The conductor 426 preferably reaches below the semiconductor 406b.

The conductors 416a and 416b function as the source electrode and the drain electrode of the transistor 490. The insulator 411 functions as a gate insulator of the transistor 490. The conductor 426 functions as the third gate electrode of the transistor 490. The insulator 432 functions as a gate insulator of the transistor 490. The conductors 421a and 421b function as the second gate electrode and the first gate electrode of the transistor 490, respectively.

In the transistor 490 illustrated in FIGS. 2A to 2C and FIG. 3, the conductor 421a and the conductor 426 partly overlap with each other with the semiconductor 406b therebetween. In the overlap region, the conduction state of the transistor 490 can be controlled under the influence of the potential of the floating node FN. Furthermore, in the transistor 490, there is a region where the conductor 421b does not overlap with the conductor 426 with the semiconductor 406b therebetween. In the non-overlap region, the conduction state of the transistor 490 can be controlled with little or no influence of the potential of the floating node FN.

In the transistor 490, when seen from the above, the entire region where the conductor 421a overlaps with the semiconductor 406b overlaps with the conductor 426. If there is a non-overlap region here, when the conduction state of the transistor 490 is controlled by the conductor 421a, the transistor 490 might be unintentionally brought into a non-conducting state; thus, malfunction might be caused. In the transistor 490, the conductor 426 includes a region that does not overlap with the conductor 421a with the semiconductor 406b therebetween. Even in the case where the conductor 426 has a region that does not overlap with the conductor 421a, operation that does not cause an unintentional non-conducting state of the transistor 490 is possible when the conduction state of the transistor 490 is controlled by the conductor 421a. The region where the conductor 426 does not overlap with the conductor 421a is preferably as small as possible. Furthermore, when seen from the above, an edge of the conductor 426 and an edge of the conductor 421a may be aligned with each other with the semiconductor 406b therebetween.

Moreover, in the transistor 490, the conductor 426 and the conductor 421b are arranged with a distance therebetween when seen from the above. However, the distance between the conductor 426 and the conductor 421b is preferably as short as possible because the resistivity of the transistor 490 in a conducting state might become high by the distance. The distance between the conductor 426 and the conductor 421b is, for example, shorter than or equal to the distance between the conductor 421a and the conductor 421b, preferably shorter than or equal to half the distance between the conductor 421a and the conductor 421b. Note that the conductor 426 and the conductor 421b may be arranged with no distance therebetween; in other words, the conductor 426 and the conductor 421b may partly overlap with each other with the semiconductor 406b therebetween in the transistor 490. Even if there is such an overlap, operation that does not cause an unintentional non-conducting state of the transistor 490 is possible when the conduction state of the transistor 490 is controlled by the conductor 421*b*. The region where the conductor 426 overlaps with the conductor 421*b* is preferably as small as possible. The width of the region where the conductor 426 overlaps with the conductor 421*b* is, for example, shorter than or equal to the distance between the conductor 421*a* and the conductor 421*b* and preferably shorter than or equal to half the distance between the conductor 421*a* and the conductor 421*b*. When seen from the above, an edge of the conductor 426 and an edge of the conductor 421*b* may be aligned with each other with the semiconductor 406*b* therebetween.

In the transistor 490 illustrated in FIGS. 2A to 2C and FIG. 3, the semiconductor 406*b* includes a second region not overlapping with the conductor 416*a*, not overlapping with the conductor 416*b*, and overlapping with the conductor 421*a* when seen from the above; a first region not overlapping with the conductor 416*a*, not overlapping with the conductor 416*b*, and overlapping with the conductor 421*b* when seen from the above; and a third region not overlapping with the conductor 416*a*, not overlapping with the conductor 416*b*, and overlapping with the conductor 426 when seen from the above. The second region and the third region partly overlap with each other. In this overlap region between the second region and the third region, the conduction state of the transistor 490 can be controlled depending on the potential of the floating node FN. The first region includes a region not overlapping with the third region. In this non-overlap region, the conduction state of the transistor 490 can be controlled independent of the potential of the floating node FN.

The second region is smaller than the third region. The second region is included in the third region. If the second region includes a region that is not included in the third region, when the conduction state of the transistor 490 is controlled by the conductor 421*a*, the transistor 490 might be unintentionally brought into a non-conducting state; thus, malfunction might be caused. The third region includes a region not overlapping with the second region. Even though such a non-overlap region is included, operation that does not cause an unintentional non-conducting state of the transistor 490 is possible when the conduction state of the transistor 490 is controlled by the conductor 421*a*. The region where the second region and the third region do not overlap with each other is preferably as small as possible for a reduction in area. An edge of the third region and an edge of the second region may be aligned with each other.

The first region and the third region are arranged with a distance therebetween. However, the distance between the first region and the third region is preferably as short as possible because the resistivity of the transistor 490 in a conducting state might become high by the distance. The distance between the first region and the third region is, for example, shorter than or equal to the distance between the conductor 421*a* and the conductor 421*b*, preferably shorter than or equal to half the distance between the conductor 421*a* and the conductor 421*b*. Note that the first region and the third region may be arranged with no distance therebetween; in other words, the first region and the third region may partly overlap with each other in the transistor 490. Even if there is such an overlap, operation that does not cause an unintentional non-conducting state of the transistor 490 is possible when the conduction state of the transistor 490 is controlled by the conductor 421*b*. The region where the first region and the third region overlap with each other is preferably as small as possible for a reduction in area. The area of the region where the first region and the third region overlap with each other is smaller than the area of the first region, preferably smaller than or equal to 50%, further preferably smaller than or equal to 25% of the area of the first region. An edge of the first region and an edge of the third region may be aligned with each other.

With the above-described structure, the transistor 490 including the first gate electrode, the second gate electrode, and the third gate electrode can be formed in a small region, leading to an area reduction of a memory cell.

The transistor 491 includes a semiconductor 407*a*, a semiconductor 407*b* over the semiconductor 407*a*, conductors 417*a* and 417*b* in contact with a top surface of the semiconductor 407*b*, a semiconductor 407*c* in contact with side surfaces of the semiconductor 407*a*, top and side surfaces of the semiconductor 407*b*, top and side surfaces of the conductor 417*a*, and top and side surfaces of the conductor 417*b*, an insulator 412 over the semiconductor 407*c*, and a conductor 427 over the insulator 412.

The conductors 417*a* and 417*b* function as the source electrode and the drain electrode of the transistor 491. The insulator 412 functions as a gate insulator of the transistor 491. The conductor 427 functions as the gate electrode of the transistor 491.

The conductor 427 electrically surrounds the semiconductor 407*b* in the channel width direction, that is, surrounds not only the top surface but also the side surfaces of the semiconductor 407*b*. That is, the transistor 491 has an s-channel structure.

When the transistor 490 is the transistor including the semiconductors 406*a*, 406*b*, and 406*c* as illustrated in FIG. 2C and FIG. 3, excellent characteristics described below can be obtained. Specifically, excellent subthreshold characteristics and an extremely low off-state current can be obtained. Furthermore, with a miniaturized transistor, a memory cell with reduced area can be obtained. By using the transistor including the semiconductors 407*a*, 407*b*, and 407*c* illustrated in FIG. 2B and FIG. 3 as the transistor 491, the transistor 491 can also have excellent characteristics like the transistor 490.

When the transistor 490 is an accumulation-type transistor whose majority carriers are electrons, an electric field extending from regions of the semiconductor 406*b* that are in contact with the source electrode and the drain electrode to the channel formation region is blocked within a short distance; thus, carriers can be easily controlled with a gate electric field even when the channel is short. Accordingly, favorable electrical characteristics can be obtained even when the transistor is miniaturized.

Unlike the case of using a semiconductor substrate as a channel formation region, in the case where the transistor is formed over an insulating surface, parasitic capacitance is not formed between the gate electrode and the body or the semiconductor substrate and thus, carriers can be easily controlled with a gate electric field. Accordingly, favorable electrical characteristics can be obtained even when the transistor is miniaturized.

By employing the s-channel structure, channel formation region controllability by a gate electric field from the side surface side of the semiconductor 406*b* becomes easy. In the structure where the conductor 426 reaches below the semiconductor 406*b*, higher controllability can be achieved. Consequently, the subthreshold swing (also referred to as S value) of the transistor 490 can be decreased, so that the current of the transistor 490 in an off state can be decreased.

By employing the s-channel structure, favorable electrical characteristics can be obtained even when the transistor is miniaturized. A semiconductor device including the miniaturized transistor can have a high integration degree and high density. For example, the channel length of the transistor 490 is preferably less than or equal to 40 nm, further preferably less than or equal to 30 nm, still further preferably less than or equal to 20 nm and the channel width of the transistor 490 is preferably less than or equal to 40 nm, further preferably less than or equal to 30 nm, still further preferably less than or equal to 20 nm.

By employing the s-channel structure, a channel might be formed in the entire semiconductor 406b (bulk). As the semiconductor 406b has a larger thickness, the channel formation region becomes larger. For example, the semiconductor 406b has a region with a thickness of greater than or equal to 20 nm, preferably greater than or equal to 40 nm, further preferably greater than or equal to 60 nm, still further preferably greater than or equal to 100 nm. Note that the semiconductor 406b has a region with a thickness of, for example, less than or equal to 300 nm, preferably less than or equal to 200 nm, further preferably less than or equal to 150 nm because the productivity of the semiconductor device might be decreased. With this structure in the s-channel structure, a large amount of current can flow between the source and the drain of the transistor, so that a high current in an on state (on-state current) can be achieved.

In the transistor 490 illustrated in FIG. 3, the conductors 416a and 416b are not in contact with the side surfaces of the semiconductor 406b. Thus, in this structure, an electric field applied from the conductor 426 functioning as a gate electrode to the side surfaces of the semiconductor 406b is less likely to be blocked by the conductors 416a and 416b. Moreover, the conductors 416a and 416b are not in contact with a top surface of the insulator 432. Thus, excess oxygen (oxygen) released from the insulator 432 is not consumed to oxidize the conductors 416a and 416b. Accordingly, excess oxygen (oxygen) released from the insulator 432 can be efficiently used to reduce oxygen vacancies in the semiconductor 406b.

Since the transistor 490 has a high resistance to short-channel effects, it can have a thicker gate insulator than conventional transistors including silicon or the like. For example, a minute transistor having channel length and width of 50 nm or less can have a gate insulator with a thickness of 5 nm or more, preferably 7 nm or more, further preferably 10 nm or more. When the gate insulator is thick, a leakage current through the gate insulator might be reduced, which improves retention characteristics of the memory cell. When the gate insulator is thick, the withstand voltage of the gate insulator can be increased, so that the transistor can be driven at a higher gate voltage. Thus, high voltage can be held by the floating node and more states can be held, increasing storage density.

At least part (or all) of the conductor 416a (and/or the conductor 416b) is in contact with at least part (or all) of a surface, a side surface, a top surface, and/or a bottom surface of a semiconductor layer, e.g., the semiconductor 406b. The contact region of the semiconductor 406b, in which donor levels are formed by entry of hydrogen into oxygen vacancy sites in some cases, becomes an n-channel conductive region. Note that a state in which hydrogen enters oxygen vacancy sites is denoted by VoH in some cases. Because of current flow in the n-channel conductive region, a high on-state current can be achieved.

In addition, as the oxide semiconductor, a c-axis aligned crystalline oxide semiconductor (CAAC-OS) described later is preferably used. A CAAC-OS is an oxide semiconductor having a plurality of c-axis aligned crystal parts. In particular, CAAC proportion described later is preferably increased. The CAAC proportion is the proportion of a region where a diffraction pattern of a CAAC-OS is observed in a predetermined area. By increasing the CAAC proportion, defects can be reduced in some cases, or carrier scattering can be reduced in some cases. A CAAC-OS with few impurities can be achieved, so that extremely low off-state current characteristics can be achieved, for example. In the case of a high quality CAAC-OS, for example, the CAAC proportion is higher than or equal to 50%, preferably higher than or equal to 80%, further preferably higher than or equal to 90%, still further preferably higher than or equal to 95% and lower than or equal to 100%.

Furthermore, it is effective to reduce the concentration of impurities in the semiconductor 406b to make the oxide semiconductor intrinsic or substantially intrinsic. The term "substantially intrinsic" refers to the state where an oxide semiconductor has a carrier density lower than $1 \times 10^{17}/cm^3$, preferably lower than $1 \times 10^{15}/cm^3$, further preferably lower than $1 \times 10^{13}/cm^3$. In the oxide semiconductor, hydrogen, nitrogen, carbon, silicon, and a metal element other than main components of the oxide semiconductor are impurities. For example, hydrogen and nitrogen form donor levels to increase the carrier density.

A transistor including a substantially intrinsic oxide semiconductor has a low carrier density and thus, the transistor rarely has negative threshold voltage. In addition, because of few carrier traps in the oxide semiconductor, the transistor including the oxide semiconductor has a small variation in electrical characteristics and high reliability. Furthermore, the transistor including the oxide semiconductor can make the off-state current extremely low.

For example, the drain current at the time when the transistor including the oxide semiconductor is off can be less than or equal to $1 \times 10^{-18}$ A, preferably less than or equal to $1 \times 10^{-21}$ A, further preferably $1 \times 10^{-24}$ A at room temperature (approximately 25° C.); or less than or equal to $1 \times 10^{-15}$ A, preferably $1 \times 10^{-18}$ A, further preferably less than or equal to $1 \times 10^{-21}$ A at 85° C. The off state of a transistor refers to a state where the gate voltage is lower than the threshold voltage in an n-channel transistor. Specifically, when the gate voltage is lower than the threshold voltage by 1 V or more, 2 V or more, or 3 V or more, the transistor is off.

Note that the above-described three-layer structure is an example. For example, a two-layer structure without the semiconductor 406a or the semiconductor 406c may be employed. A four-layer structure in which any one of the semiconductors described as examples of the semiconductors 406a, 406b, and 406c is provided under or over the semiconductor 406a or under or over the semiconductor 406c may be employed. An n-layer structure (n is an integer of five or more) in which any one of the semiconductors described as examples of the semiconductors 406a, 406b, and 406c is provided at two or more of the following positions: over the semiconductor 406a, under the semiconductor 406a, over the semiconductor 406c, and under the semiconductor 406c, may be employed.

Next, a stacked structure of the transistors will be described with reference to the cross-sectional view of the memory cell 500 in FIG. 3.

The memory cell 500 illustrated in FIG. 3 includes the substrate 400, the insulator 442 over the substrate 400, the transistor 490 over the insulator 442, an insulator 452 over the transistor 490, an insulator 462 over the insulator 452, the insulator 444 over the insulator 462, an insulator 434 over the insulator 444, the transistor 491 over the insulator 434, an insulator 454 over the transistor 491, an insulator 464 over the insulator 454, and a conductor 480 over the insulator 464. Openings are provided in the insulators as necessary, and conductors are provided in the openings. A plurality of conductors are connected as necessary through the conductors. Another one or plurality of layers of insulators or conductors may be further provided over the conductor 480.

The conductor 480 includes a region functioning as the bit line BL. The conductor 427 has a function of the gate electrode of the transistor 491 and a function of the write word line WW. The conductor 421a has a function of the gate electrode of the transistor 490 and a function of the read word line RW. The conductor 421b has a function of the gate electrode of the transistor 490 and a function of the selection word line SW. Note that the conductor 416a is connected to the source line SL (not shown). The one of the source electrode and the drain electrode (the conductor 417a) of the transistor 491 is electrically connected to the third gate electrode (the conductor 426) of the transistor 490. The other of the source electrode and the drain electrode (the conductor 416b) of the transistor 490 is electrically connected to the other of the source electrode and the drain electrode (the conductor 417b) of the transistor 491. The other of the source electrode and the drain electrode (the conductor 417b) of the transistor 491 is electrically connected to the bit line BL (the conductor 480). In addition, the conductor 417a and the conductor 426 have a function of the floating node FN.

The transistor 491 is stacked over the transistor 490. The channel formation region of the transistor 491 and the channel formation region of the transistor 490 overlap with each other.

By stacking the transistor 490 and the transistor 491, the memory cell 500 can be reduced in size. By overlapping the transistor 490 and the transistor 491 with each other, the memory cell 500 can be reduced in size.

With this structure, the transistor 490 whose respective gate electrodes are connected to the read word line RW, the selection word line SW, and the floating node FN can be formed in a small region, so that the size of the memory cell can be reduced. In particular, the conductors 421b having a function of the selection word lines SW, that is, the first gate electrodes included in the transistors 490 in adjacent memory cells connected to the same bit line BL can be directly connected to each other. By sharing the selection word line SW between adjacent memory cells connected to the same bit line, an area reduction is possible. Furthermore, the conductors 421a which are conductors having a function of the read word lines RW, that is, the second gate electrodes included in the transistors 490 in adjacent memory cells connected to the same bit line BL can be directly connected to each other. By sharing the read word line RW between adjacent memory cells connected to the same bit line, an area reduction is possible.

The insulator 432 is preferably an insulator containing excess oxygen.

The insulator containing excess oxygen is an insulator from which oxygen is released by heat treatment, for example. Silicon oxide containing excess oxygen is silicon oxide from which oxygen can be released by heat treatment or the like, for example. Therefore, the insulator 432 is an insulator in which oxygen can be moved. In other words, the insulator 432 may be an insulator having an oxygen-transmitting property. For example, the insulator 432 may be an insulator having a higher oxygen-transmitting property than the semiconductor positioned over the insulator 432.

The insulator containing excess oxygen has a function of reducing oxygen vacancies in the semiconductor positioned over the insulator, in some cases. Such oxygen vacancies form DOS in the semiconductor and serve as hole traps or the like. In addition, hydrogen comes into oxygen vacancy sites and forms electrons serving as carriers, in some cases. Thus, by a reduction in oxygen vacancies in the semiconductor, the transistor can have stable electrical characteristics.

The insulator 442 is provided between the substrate 400 and the transistor 490. As the insulator 442, an oxide containing aluminum, e.g., aluminum oxide, is used, for example. The insulator 442 blocks oxygen and hydrogen, and aluminum oxide whose density is lower than 3.2 g/cm$^3$ is preferable because it has a particularly high capability of blocking hydrogen. Furthermore, aluminum oxide with low crystallinity is preferable because its capability of blocking hydrogen is particularly high.

For example, in the case where the substrate 400 is an element substrate including a Si transistor, electrical characteristics of the transistor are improved because dangling bonds of silicon can be reduced by supplying hydrogen from the outside, in some cases. The supply of hydrogen is performed by, for example, providing an insulator containing hydrogen in the vicinity of the Si transistor and performing heat treatment to diffuse and supply the hydrogen to the Si transistor.

For example, an insulator containing hydrogen may release hydrogen, the amount of which is larger than or equal to $1\times10^{18}$ atoms/cm$^3$, larger than or equal to $1\times10^{19}$ atoms/cm$^3$, or larger than or equal to $1\times10^{20}$ atoms/cm$^3$ in thermal desorption spectroscopy (TDS) analysis (converted into the number of hydrogen atoms) in the range of a surface temperature of 100° C. to 700° C. or 100° C. to 500° C.

Out of hydrogen diffused from the insulator containing hydrogen, a small amount of hydrogen reaches the transistor 490 because the insulator 442 has a function of blocking hydrogen. Hydrogen serves as carrier traps or carrier generation sources in an oxide semiconductor and causes deterioration of electrical characteristics of the transistor 490 in some cases. Therefore, blocking hydrogen by the insulator 442 is important to improve performance and reliability of the semiconductor device.

Moreover, for example, by supplying oxygen to the transistor 490 from the outside, oxygen vacancies in the oxide semiconductor can be reduced; thus, electrical characteristics of the transistor are improved in some cases. The supply of oxygen may be performed by heat treatment in an atmosphere containing oxygen, for example. Alternatively, for example, an insulator containing excess oxygen (oxygen) may be provided in the vicinity of the transistor 490 and heat treatment may be performed so that the oxygen may be diffused and supplied to the transistor 490. Here, an insulator containing excess oxygen is used as the insulator 432.

The diffused oxygen might reach the Si transistor through layers; however, since the insulator 442 has a function of blocking oxygen, the amount of oxygen which reaches the Si transistor is small. The entry of oxygen into silicon might be a factor of decreasing the crystallinity of silicon or inhibiting carrier movement. Therefore, blocking oxygen by the insulator 442 is important to improve performance and reliability of the semiconductor device.

The insulator 452 is preferably provided over the transistor 490. The insulator 452 has a function of blocking oxygen and hydrogen. For the insulator 452, the description of the insulator 442 can be referred to, for example. Furthermore, for example, the insulator 452 has a higher capability of blocking oxygen and hydrogen than the semiconductor 406a and/or the semiconductor 406c.

When the semiconductor device includes the insulator 452, outward diffusion of oxygen from the transistor 490 can be suppressed. Accordingly, oxygen (excess oxygen) contained in the insulator 432 or the like can be efficiently supplied to the transistor 490. Since the insulator 452 blocks entry of impurities including hydrogen from layers above the insulator 452 or the outside of the semiconductor device, deterioration of electrical characteristics of the transistor 490 due to entry of impurities can be suppressed.

Although in the above description, the insulator 442 and/or the insulator 452 is described separately from the transistor 490 for convenience, the insulator 442 and/or the insulator 452 may be part of the transistor 490.

The insulator 434 is preferably an insulator containing excess oxygen. For the insulator 434, the description of the insulator 432 can be referred to, for example.

Furthermore, the insulator 444 is preferably an insulator that blocks oxygen and hydrogen. For the insulator 444, the description of the insulator 442 can be referred to, for example.

Moreover, the insulator 454 is preferably an insulator that blocks oxygen and hydrogen. For the insulator 454, the description of the insulator 452 can be referred to, for example.

In this embodiment, although transistors including an oxide semiconductor in their channel formation regions can be used as the transistors 490 and 491 for example, one embodiment of the present invention is not limited to this example. For example, depending on circumstances or conditions, the transistor 490 may include Si (silicon), Ge (germanium), SiGe (silicon germanium), GaAs (gallium arsenide), or the like in a channel formation region, the vicinity of the channel, a source region, a drain region, or the like.

In this specification and the like, a transistor such as the transistor 490 or 491 can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), and polyether sulfone (PES). Another example is a synthetic resin such as an acrylic resin. Alternatively, polypropylene, polyester, polyvinyl fluoride, polyvinyl chloride, or the like can be used. Other examples are polyamide, polyimide, aramid, epoxy, an inorganic vapor deposition film, paper, and the like. In particular, when a transistor is formed using a semiconductor substrate, a single crystal substrate, an SOI substrate, or the like, the transistor can have few variations in characteristics, size, shape, or the like, high current supply capability, and a small size. Forming a circuit with the use of such transistors leads to a reduction in power consumption of the circuit or high integration of the circuit.

Alternatively, a flexible substrate may be used as the substrate such that the transistor may be provided directly on the flexible substrate. Still alternatively, a separation layer may be provided between the substrate and the transistor. The separation layer can be used when part or the whole of a semiconductor device formed over the separation layer is separated from the substrate and transferred onto another substrate. In such a case, the transistor can be transferred onto a substrate having low heat resistance or a flexible substrate as well. For the above-described separation layer, a stack including inorganic films, which are a tungsten film and a silicon oxide film, or an organic resin film of polyimide or the like formed over a substrate can be used, for example.

In other words, after the transistor is formed using a substrate, the transistor may be transferred onto another substrate. Example of the substrate onto which the transistor is transferred are, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent characteristics, a transistor with low power consumption, or a device with high durability, high heat resistance, or reduced weight or thickness.

Next, the operation of the memory cell 500 illustrated in FIG. 1 will be described with reference to FIGS. 4A to 4D, FIG. 5, FIG. 6, and FIG. 7.

An example in which the transistor 490 and the transistor 491 are n-channel transistors will be described below. The transistor 490 may be a p-channel transistor. Furthermore, the transistor 491 may be a p-channel transistor.

FIGS. 4A to 4D illustrate voltages used in the operation of the memory cell 500. Here the case where the floating node FN stores k kinds of states (k is an integer of two or more) is assumed. FIGS. 4A, 4B, 4C, and 4D illustrate the potential of the floating node FN, the potential of the write word line WW, the potential of the read word line RW, and the potential of the selection word line SW, respectively.

As described above, there exist at least two threshold voltages in the transistor 490, that is, the threshold voltage Vth1 relating to the first gate electrode and the threshold voltage Vth23 relating to the second gate electrode and the third gate electrode. In the operation of the memory cell 500, the transistor 490 has a function equivalent to the function of a circuit in which two transistors, that is, a transistor having the threshold voltage Vth1 (the transistor 490_1) and a transistor having the threshold voltage Vth23 (the transistor 490_23), are connected in series. In other words, only when both the transistor 490_1 and the transistor 490_23 are on, the transistor 490 is on.

Figure 4A:
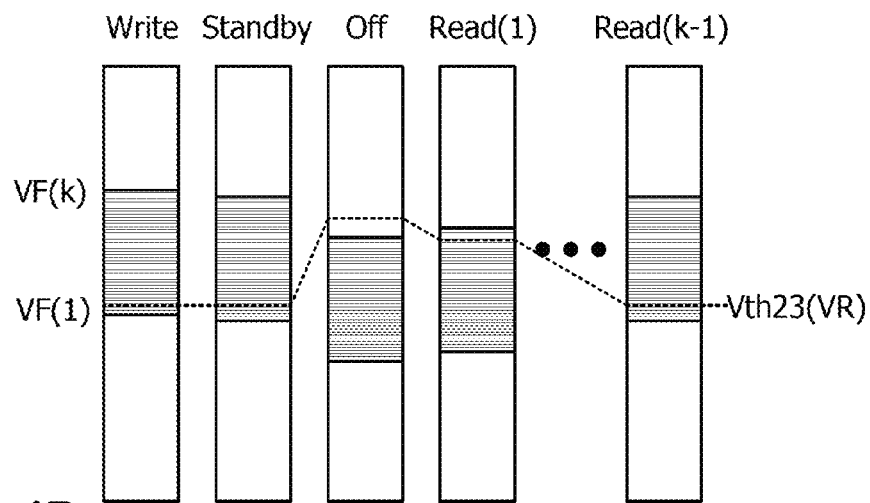
FIGS. 4A to 4D illustrate voltages that relate to operation of a memory cell.
Figure 4B:
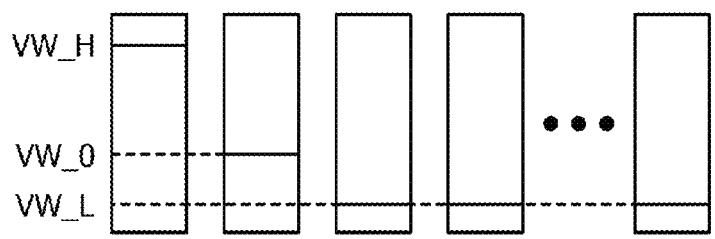
Figure 4C:
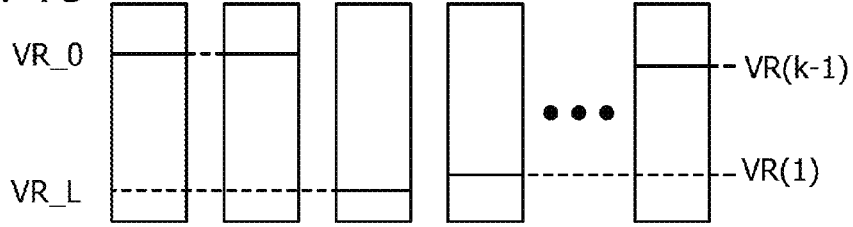
Figure 4D:
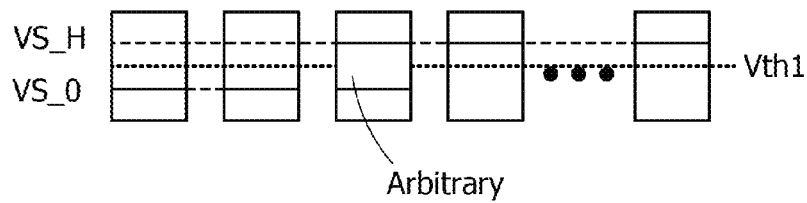

In FIGS. 4A to 4D, the state "Write" shows a state where the transistor 491 is on and a potential of the bit line BL is supplied to the floating node FN. To the floating node FN, a potential V(i) (i is an integer of one or more and k or less) is supplied. The state where V(i) is supplied is referred to as the i-th state. Here, the following is satisfied: V(i)<V(i+1) (i is an integer of one or more and (k−1) or less). In FIG. 4A, the range of potentials higher than or equal to VF(1) and lower than or equal to VF(k) is shown by a hatching pattern. VW_H is supplied to the WW, so that the transistor 491 is turned on regardless of the k kinds of states. Preferably, VW_H is higher than VF(k) by Vth(491) or more. That is, VW_H>VF(k)+Vth(491) is preferably satisfied. Here, Vth(491) is the threshold voltage of the transistor 491. In this way, even when the maximum potential VF(k) is supplied to the FN, the transistor 491 can keep the on state. The potential VR_0 is the potential supplied to the RW in writing. In addition, VS_0 is supplied to the SW to turn off the transistor 490_1. That is, VS_0 is the voltage satisfying VS_0<Vth1.

In FIGS. 4A to 4D, the state "Standby" is a state where the potential of the floating node FN is held. VR_0 is supplied to the RW. VW_0 is supplied to the WW, so that the transistor 491 is turned off regardless of the k kinds of states. Even in the first state, VW_0 is a potential that brings the transistor 491 into an off state or a potential that makes a drain current of the transistor 491 small enough. Note that the potential of the floating node FN immediately after the writing may vary from the potential written to the floating node FN to some extent owing to a gate-drain capacitance (or a gate-source capacitance) of the transistor 491. Furthermore, VS_0 is supplied to the SW, and the transistor 490_1 is off.

In FIGS. 4A to 4D, the state "Off" is a state where the transistor 490_23 is off regardless of the k kinds of states. The state "Off" is used for a memory cell where reading is not performed during reading operation, in some cases. VR_L is supplied to the RW, so that the transistor 490_23 is brought into an off state even in the k-th state. That is, VR_L is a potential satisfying $VF_k$ (VR_L)<Vth23 (VR_L). Here, the potential of the floating node FN in the i-th state when the potential VR is supplied to the RW is referred to as $VF_i$ (VR). Moreover, VW_L is supplied to the WW to bring the transistor 491 into an off state. VW_L is a potential that brings the transistor 491 into an off state or a potential that makes a drain current of the transistor 491 small enough even in the first state with a low potential when VR_L is supplied to the RW. Note that the potential of the SW may be either lower than or higher than the threshold voltage Vth1 of the transistor 490_1. In either case, the transistor 490 is brought into an off state.

In FIGS. 4A to 4D, the state "Read (1)" is a state where the transistor 490_23 is turned on in the k-th state and the transistor 490_23 remains off in the (k−1)-th state. In other words, the state "Read (1)" is a state where the transistor 490_23 is off when any of (k−1) kinds of potentials except the k-th state is written. By supplying the potential VR(1) to the RW, such a state is obtained. That is, VR(1) is a potential satisfying $VF_{(k-1)}$ (VR(1))<Vth23 (VR(1))<$VF_k$ (VR(1)). Furthermore, VW_L is supplied to the WW to bring the transistor 491 into an off state. VS_H is supplied to the SW to bring the transistor 490_1 into an on state. That is, VS_H is a voltage satisfying VS_H>Vth1.

In FIGS. 4A to 4D, the state "Read (k−1)" is a state where the transistor 490_23 is turned on in the case where VF(2) is written and the transistor 490_23 remains off in the case where VF(1) is written. In other words, the state "Read (k−1)" is a state where the transistor 490_23 is on in the case where any of (k−1) kinds of potentials except VF(1) is written. By supplying a potential VR(k−1) to the RW, such a state is obtained. That is, VR(k−1) is a potential satisfying $VF_1$ (VR (k−1))<Vth23 (VR(k−1))<$VF_2$ (VR(k−1)). Furthermore, VW_L is supplied to the WW to bring the transistor 491 into an off state. VS_H is supplied to the SW to bring the transistor 490_1 into an on state.

Note that the transistor 490 may be a transistor which is not controlled by the second gate electrode and includes the channel formation region (the channel formation region C) controlled by the third gate electrode. When the voltage Vg3 of the third gate electrode exceeds Vth3, a channel is formed or carriers are induced in the channel formation region C. In the operation of the memory cell 500, when the transistor 490 is on, Vg3 is adjusted so as to satisfy Vg3>Vth3. To satisfy this relation in the state Read(i), the following relation is preferably satisfied: Vth3<Vth23 (VR(i)) (i is 1 to (k−1)). For example, in the case where an equation Vth23 (VR(i))=Vth23 (Vg2)−c×(VR(i)−Vg2) is satisfied, a channel can be formed in the channel formation region C in the conducting state of the transistor 490 by making VR(i) lower than the voltage Vg2_0 of the second gate electrode of when Vth3 and Vth23 (Vg2_0) are equal. For example, when both the threshold voltages are the same at Vg2 of 0 V, by satisfying the condition VR(i)<0 V, the relation Vth3<Vth23 (VR(i)) can be satisfied. That is, when the transistor 490 is on, a channel is formed in the channel formation region C.

Note that the transistor 490 may include the channel formation region (also referred to as the channel formation region D) controlled by the first gate electrode and the third gate electrode. When a relation Vg3>Vth13(Vg1) is satisfied, a channel is formed or carriers are induced in the channel formation region D. In the operation of the memory cell 500, when the transistor 490 is on, Vg3 is adjusted so as to satisfy Vg3>Vth13(Vg1). To satisfy this relation in the state Read(i), the following relation is preferably satisfied: Vth13 (VS_H) <Vth23 (VR(i)) (i is 1 to (k−1)). For example, in the case where an equation Vth23 (VR(i))=Vth23 (Vg2)−c×(VR(i)−Vg2) and an equation Vth13 (VR(i))=Vth13 (Vg1)−c× (VS_H−Vg1) are satisfied, a channel can be formed in the channel formation region D in the conducting state of the transistor 490 by satisfying a relation VS_H−Vg1_0>VR(i)−Vg2_0, where Vg1_0 and Vg2_0 are potentials of the first gate electrode and the second gate electrode, respectively, of when Vth23 is equal to Vth13. For example, when conditions Vg1_0=Vg2_0 and VS_H>VR(i) are satisfied, the relation Vth13 (VS_H)<Vth23 (VR(i)) can be satisfied. That is, when the transistor 490 is on, a channel is formed in the channel formation region D.

The semiconductor device of one embodiment of the present invention may include a memory cell array in which such memory cells 500 are arranged in array (in a matrix).

Figure 5:
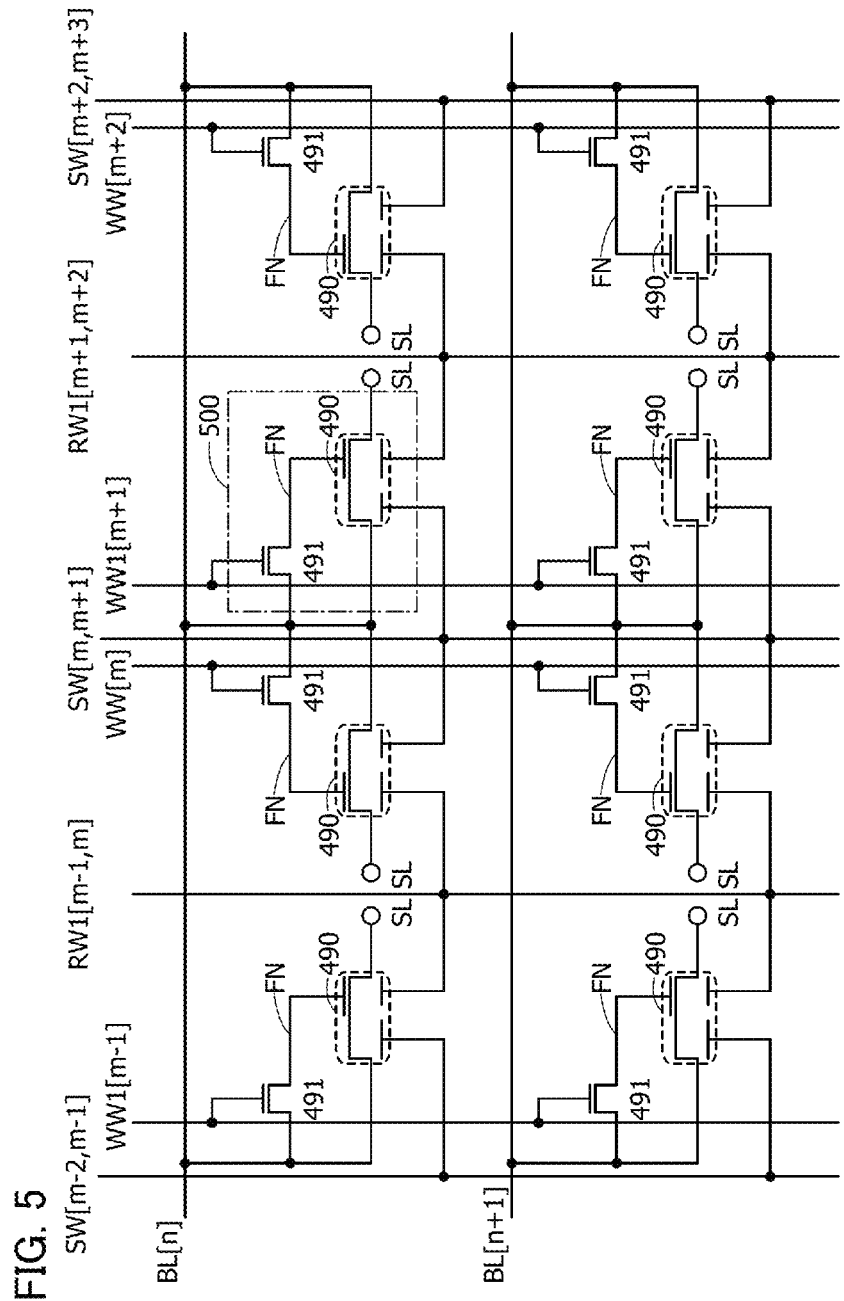
FIG. 5 is a circuit diagram of a memory cell array.

FIG. 5 illustrates part of the circuit configuration of the memory cell array for explaining the operation of the memory cells. FIG. 5 illustrates eight memory cells which are each connected to the n-th bit line BL[n] or the (n+1)-th bit line BL[n+1] and any one of the (m−1)-th word line WW[m−1] to the (m+2)-th word line WW[m+2] in the memory cell array.

FIG. 5 illustrates eight memory cells in two rows and four columns. The memory cells in the first row from the top in the drawing are connected to the n-th bit line BL[n] in the memory cell array, and the memory cells in the second row are connected to the (n+1)-th bit line BL[n+1] in the memory cell array. The memory cells in the first column from the left in the drawing are connected to the (m−1)-th word line WW[m−1] in the memory cell array, the memory cells in the second column are connected to the m-th word line WW[m] in the memory cell array, the memory cells in the third column are connected to the (m+1)-th word line WW[m+1] in the memory cell array, and the memory cell in the fourth column are connected to the (m+2)-th word line WW[m+2] in the memory cell array. The read word line RW[m−1, m] is connected to the memory cells in the first and second columns from the left in the drawing, and the read word line RW[m+1, m+2] is connected to the memory cells in the third and fourth columns. The selection word line SW[m−2, m−1] is connected to the memory cells in the first column from the left in the drawing, the selection word line SW[m, m+1] is connected to the memory cells in the second and third columns, and the selection word line SW[m+2, m+3] is connected to the memory cells in the fourth column. Note that the source line SL may be shared by all the memory cells.

Note that the bit lines and the write word lines can be provided so as to intersect with each other. Furthermore, the write word lines, the read word lines, and the selection word lines may be parallel to each other.

As illustrated in FIG. 5, in one embodiment of the present invention, adjacent memory cells may share one read word line RW. Furthermore, adjacent memory cells may share one selection word line SW. In particular, when three adjacent memory cells connected to the same bit line, a memory cell (i), a memory cell (i+1), and a memory cell (i+2) (i is an integer of one or more) are assumed, the memory cell (i) and the memory cell (i+1) may share the same read word line RW, and the memory cell (i+1) and the memory cell (i+2) may share the same selection word line SW.

Moreover, in a semiconductor device of one embodiment of the present invention including adjacent first and second memory cells, a first conductor, that is, the first gate electrode of the transistor 490 included in the first memory cell may be electrically connected to a first conductor, that is, the first gate electrode of the transistor 490 included in the second memory cell.

Furthermore, in a semiconductor device of one embodiment of the present invention including adjacent first and second memory cells, a second conductor, that is, the second gate electrode of the transistor 490 included in the first memory cell may be electrically connected to a second conductor, that is, the second gate electrode of the transistor 490 included in the second memory cell.

With the above-described configuration, the number of signal lines can be reduced compared with the case where different read word lines and selection word lines are connected to respective memory cells. Consequently, the size of the memory cells can be reduced. With this configuration, the number of read word lines becomes approximately half the number of write word lines. In addition, the number of selection word lines becomes approximately half the number of write word lines. Accordingly, the number of signal lines per memory cell is as follows: 1 bit line, 1 write word line, approximately 0.5 read word lines, and approximately 0.5 selection word lines; approximately 3 lines in total.

Figure 6:
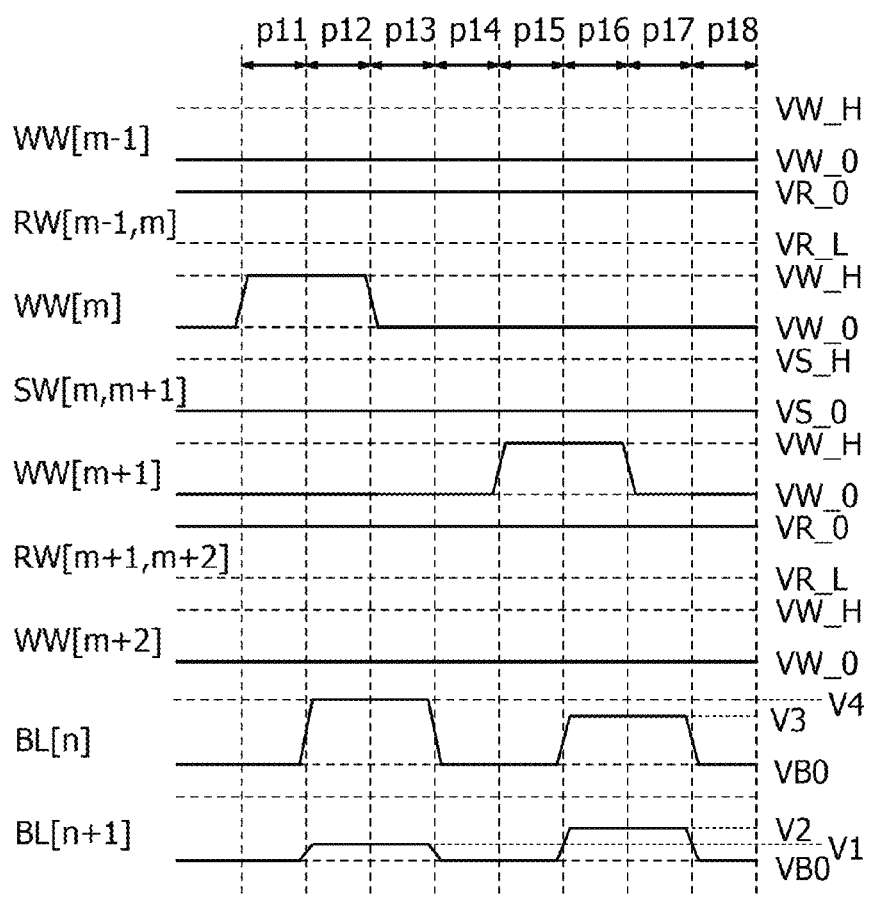
FIG. 6 is a timing chart showing a writing operation of a memory cell.

FIG. 6 is a timing chart showing an example of writing operation of the memory cell array illustrated in FIG. 5, specifically, the example of writing four kinds of potentials V1, V2, V3, and V4 (V1<V2<V3<V4) into four memory cells which are connected to the bit line BL[n] or the bit line BL[n+1] and connected to the write word line WW[m] or the write word line WW[m+1] among the memory cells illustrated in FIG. 5. The states where V1, V2, V3, and V4 are written are also referred to as a first state, a second state, a third state, and a fourth state, respectively.

The timing chart of FIG. 6 consists of the part showing periods p11 to p14 where data writing to the memory cells connected to the WW[m] is performed and the part showing periods p15 to p18 where data writing to the memory cells connected to the WW[m+1] is performed.

Note that the memory cells where writing is not performed except for the memory cells illustrated in FIG. 5 are controlled throughout the writing period as follows. VW_0 is supplied to the write word lines WW connected to the memory cells to bring the transistors 491 into a non-conducting state. VR_0 is supplied to the read word lines RW. VS_0 is supplied to the selection word lines SW to bring the transistors 490 into a non-conducting state. That is, the state "Standby" is made.

Moreover, throughout the writing operation, a potential V0 is supplied to the source lines SL (not shown).

In the period 11 in FIG. 6, VS_0 is supplied to the SW[m−2, m−1] (not shown), VW_0 is supplied to the WW[m−1], VR_0 is supplied to the RW[m−1, m], VW_H is supplied to the WW[m], VS_0 is supplied to the SW[m, m+1], VW_0 is supplied to the WW[m+1], VR_0 is supplied to the RW[m+1, m+2], VW_0 is supplied to the WW[m+2], and VS_0 is supplied to the SW[m+2, m+3] (not shown). Consequently, the selected memory cells, that is the memory cells connected to the WW[m] are brought into a state where writing is performed (state "Write"). In the other memory cells, that is, the memory cells connected to the WW[m−1], the WW[m+1], and the WW[m+2], writing is not performed (state "Standby"). By supplying VS_0 to the selection word lines SW, the transistors 490 in all the eight memory cells are brought into a non-conducting state. A potential VB0 is supplied to the bit lines BL[n] and BL[n+1]. The potential VB0 is, for example, a bit line potential in the standby state. For example, the potential VB0 may be the same as the potential V0 supplied to the source lines.

In the period p12 in FIG. 6, the potential V4 is supplied to the bit line BL[n], and the potential V1 is supplied to the BL[n+1]. The other wirings are held at the potentials in the previous period. As a result, the potential V4 is supplied to the FN of the selected memory cell connected to the bit line BL[n], and V1 is supplied to the FN of the selected memory cell connected to the bit line BL[n+1].

In the period p13 in FIG. 6, VW_0 is supplied to the write word line WW[m]. The other wirings are held at the potentials in the previous period. As a result, the transistors 491 in the selected memory cells connected to the write word line WW[m] are brought into a non-conducting state, and charges accumulated in the floating nodes FN are held. That is, the writing state is terminated. By maintaining the potentials of the read word line RW[m−1, m], the selection word line SW[m, m+1], the bit line BL[n], and BL[n+1] after the writing, stable writing can be performed. If these potentials vary at the same time as the potential of the write word line WW[m] varies, the writing state might be affected.

In the period p14 in FIG. 6, the potential VB0 is supplied to the bit lines BL[n] and BL[n+1]. The other wirings are held at the potentials in the previous period. Thus, the writing operation of the memory cells connected to the write word line WW[m] is finished.

In the period p15 in FIG. 6, VS_0 is supplied to the SW[m−2, m−1] (not shown), VW_0 is supplied to the WW[m−1], VR_0 is supplied to the RW[m−1, m], VW_0 is supplied to the WW[m], VS_0 is supplied to the SW[m, m+1], VW_H is supplied to the WW[m+1], VR_0 is supplied to the RW[m+1, m+2], VW_0 is supplied to the WW[m+2], and VS_0 is supplied to the SW[m+2, m+3] (not shown). Consequently, the selected memory cells, that is the memory cells connected to the WW[m+1] are brought into a state where writing is performed (state "Write"). In the other memory cells, that is, the memory cells connected to the WW[m−1], the WW[m], and the WW[m+2], writing is not performed (state "Standby"). By supplying VS_0 to the selection word lines, the transistors 490 in all the eight memory cells are brought into a non-conducting state. The potential VB0 is supplied to the bit lines BL[n] and BL[n+1].

In the period p16 in FIG. 6, the potential V3 is supplied to the bit line BL[n], and the potential V2 is supplied to the BL[n+1]. The other wirings are held at the potentials in the previous period. As a result, the potential V3 is supplied to the FN of the selected memory cell connected to the bit line BL[n], and V2 is supplied to the FN of the selected memory cell connected to the bit line BL[n+1].

In the period p17 in FIG. 6, VW_0 is supplied to the write word line WW[m+1]. The other wirings are held at the potentials in the previous period. As a result, the transistors 491 in the selected memory cells connected to the write word line WW[m+1] are brought into a non-conducting state, and charges accumulated in the floating nodes FN are held. That is, the writing state is terminated. The description of the period p13 can be referred to.

In the period p18 in FIG. 6, the potential VB0 is supplied to the bit lines BL[n] and BL[n+1]. The other wirings are held at the potentials in the previous period. Thus, the writing operation of the memory cells connected to the write word line WW[m+1] is finished.

By the above-described data writing in the periods p11 to p18, predetermined states are written into the selected memory cells. Note that during the writing operation period, the transistors 490 in the selected memory cells are off, and the transistors 490 in unselected memory cells are also off. Accordingly, even when the potential V0 supplied to the source lines SL and the potential supplied to the bit lines BL are different, a current in an on state never flows through the transistor 490.

Figure 7:
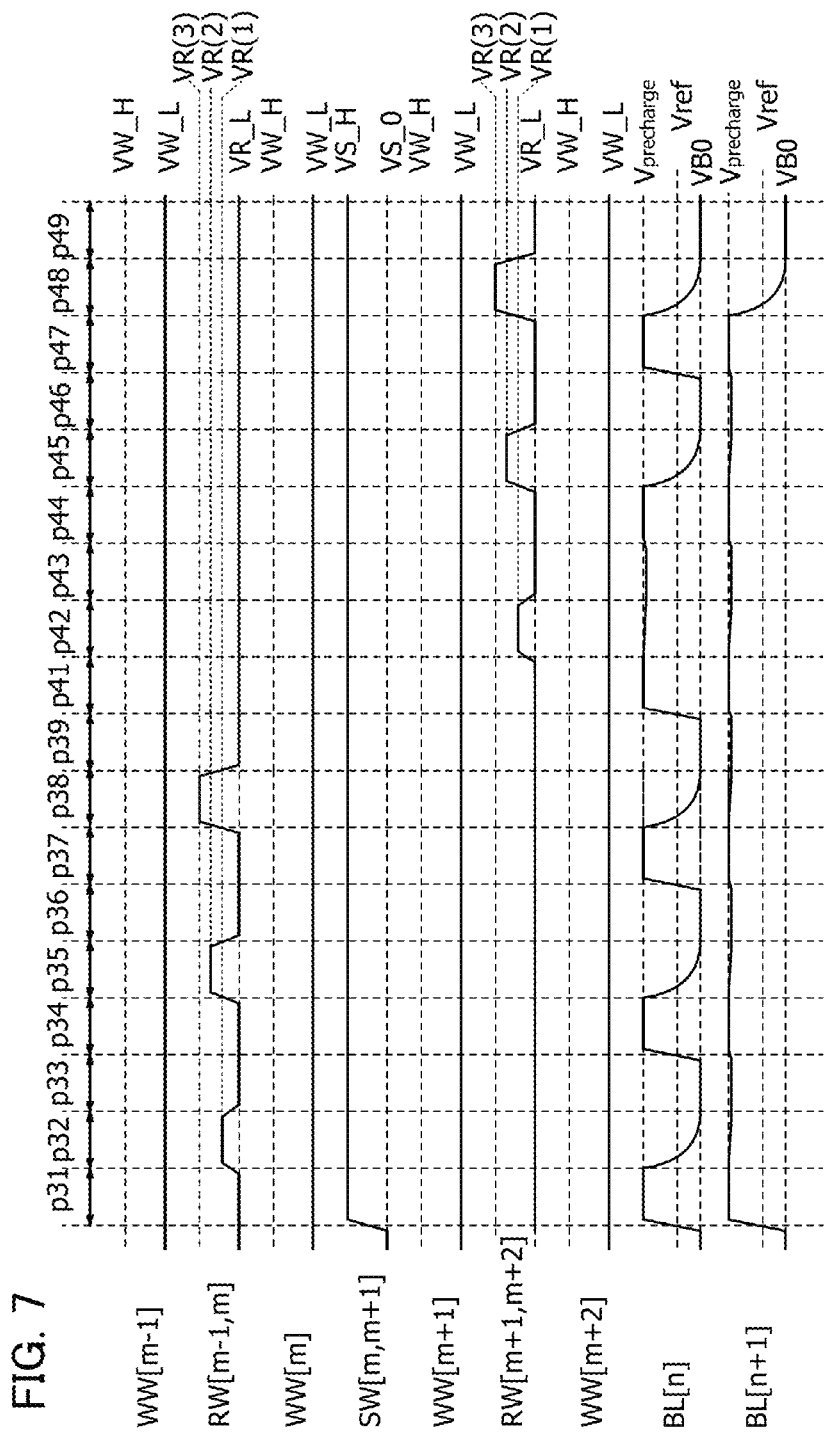
FIG. 7 is a timing chart showing a reading operation of a memory cell.

FIG. 7 is a timing chart showing an example of reading operation of the memory cell array illustrated in FIG. 5, specifically, the example of reading four kinds of potentials from four memory cells which are connected to the bit line BL[n] or the bit line BL[n+1] and connected to the write word line WW[m] or the write word line WW[m+1] among the memory cells illustrated in FIG. 5.

The timing chart of FIG. 7 is a timing chart in periods p31 to p39 where data held in the memory cells connected to the WW[m] is read and in periods p41 to p49 where data held in the memory cells connected to the WW[m+1] is read. In reading operation, to make the transistors 490 always off, VW_L is supplied to the write word lines WW[m−1] to WW[m+2] throughout the reading period. The following description is made focusing on the read word lines and the selection word lines.

Note that the memory cells where reading is not performed except for the memory cells illustrated in FIG. 5 are controlled throughout the reading period as follows. VW_0 is supplied to the write word lines WW connected to the memory cells to bring the transistors 491 into a non-conducting state. VR_0 is supplied to the read word lines RW. VS_0 is supplied to the selection word lines SW to bring the transistors 490 into a non-conducting state. That is, the state "Standby" is made.

Moreover, throughout the reading operation, the potential V0 is supplied to the source lines SL (not shown).

In the period p31 in FIG. 7, VS_0 is supplied to the SW[m−2, m−1] (not shown), VR_L is supplied to the RW[m−1, m], VS_H is supplied to the SW[m, m+1], VR_L is supplied to the RW[m+1, m+2], and VS_0 is supplied to the SW[m+2, m+3] (not shown). By supplying VR_L to the read word lines RW, the transistors 490_23 in the eight memory cells can be brought into an off state (state "Off"). Accordingly, the transistors 490 in the eight memory cells are all off. Furthermore, VS_H is supplied to the selection word line SW[m, m+1] to bring the transistors 490_1 in the four memory cells connected to the SW[m, m+1] in an on state. Thus, in the four memory cells connected to the SW[m, m+1], the conduction state of the transistor 490 depends on the conduction state of the transistor 490_23. A potential $V_{precharge}$ is supplied to the bit lines BL[n] and BL[n+1]. The period p31 is a precharge period. The potential $V_{precharge}$ is a precharge potential. After the period p31, the bit lines BL[n] and BL[n+1] are brought into a floating state.

In the period p32 in FIG. 7, VR(1) is supplied to the read word line RW[m−1, m], so that the selected memory cells, that is, the memory cells connected to both the RW[m−1, m] and the SW[m, m+1] are brought into the state Read (1). In the state Read (1), the transistor 490 is turned on in the case where the fourth state is stored and remains off in the other cases. Since the selected memory cell connected to the bit line BL[n] stores the fourth state, the transistor 490 therein is brought into an on state. Consequently, the bit line BL[n] in a floating state is electrically connected to the source line SL through the transistor 490 in an on state. Then, the bit line BL[n] is charged or discharged, so that the potential of the bit line BL[n] changes from $V_{precharge}$ to V0. Moreover, since the selected memory cell connected to the bit line BL[n+1] stores the first state, the transistor 490 therein is off. As a result, the potential of the bit line BL[n+1] in a floating state is maintained.

In the period p33 in FIG. 7, VR_L is supplied to the read word line RW[m−1, m], so that the transistors 490_23 in the selected memory cells are brought into an off state (state "Off"). Accordingly, the transistors 490 in the selected memory cells are brought into an off state. Consequently, the potentials in the previous period are held in the bit line BL[n] and the bit line BL[n+1]. In the periods p32 and p33, by detecting the potentials of the bit lines BL[n] and BL[n+1] with a read circuit, reading can be performed.

The operation in the periods p34 to p36 in FIG. 7 is similar to that in the periods p31 to p33 except that VR(2) is supplied to the RW[m−1, m] instead of VR(1). When VR(2) is supplied to the RW[m−1, m], the transistor 490 is on in the case where the third state or the fourth state is stored in the selected memory cell and is off in the other cases. Since the selected memory cell connected to the bit line BL[n] stores the fourth state, the transistor 490 therein is brought into an on state. Since the selected memory cell connected to the bit line BL[n+1] stores the first state, the transistor 490 therein is off. As a result, in the period p35, the potential of the bit line BL[n] changes from $V_{precharge}$ to V0. The potential of the bit line BL[n+1] is maintained.

The operation in the periods p37 to p39 in FIG. 7 is similar to that in the periods p31 to p33 except that VR(3) is supplied to the RW[m−1, m] instead of VR(1). When VR(3) is supplied to the RW[m−1, m], the transistor 490 is turned on in the case where any of the second to fourth states is stored in the selected memory cell and remains off in the case where the first state is stored in the selected memory cell. Since the selected memory cell connected to the bit line BL[n] stores the fourth state, the transistor 490 therein is brought into an on state. Since the selected memory cell connected to the bit line BL[n+1] stores the first state, the transistor 490 therein is off As a result, in the period p38, the potential of the bit line BL[n] changes from $V_{precharge}$ to V0. The potential of the bit line BL[n+1] is maintained.

The operation in the periods p41 to p43 in FIG. 7 is similar to that in the periods p31 to p33 except that the potential of the read word line RW[m−1, m] and the potential of the read word line RW[m+1, m+2] are replaced with each other. That is, the selected memory cells are not the memory cells connected to both the RW[m−1, m] and the SW[m, m+1] but the memory cells connected to both the RW[m+1, m+2] and the SW[m, m+1]. In the period p42, by supplying VR(1) to the RW[m+1, m+2], the selected memory cells are brought into the state Read (1). In other words, the transistor 490 is on in the case where the fourth state is stored in the selected memory cell and is off in the other cases. Since the selected memory cell connected to the bit line BL[n] stores the third state, the transistor 490 therein is brought into an off state. Since the selected memory cell connected to the bit line BL[n+1] stores the second state, the transistor 490 therein is off. As a result, in the period p43, the potentials of the bit lines BL[n] and BL[n+1] are maintained. In the periods p42 and p43, by detecting the potentials of the bit lines BL[n] and BL[n+1] with a read circuit, reading can be performed.

The operation in the periods p44 to p46 in FIG. 7 is similar to that in the periods p41 to p43 except that VR(2) is supplied to the RW[m+1, m+2] instead of VR(1). When VR(2) is supplied to the RW[m+1, m+2], the transistor 490 is turned on in the case where the third state or the fourth state is stored in the selected memory cell and remains off in the other cases. Since the selected memory cell connected to the bit line BL[n] stores the third state, the transistor 490 therein is brought into an on state. Since the selected memory cell connected to the bit line BL[n+1] stores the second state, the transistor 490 therein is off. As a result, in the period p45, the potential of the bit line BL[n] changes from $V_{precharge}$ to V0. The potential of the bit line BL[n+1] is maintained.

The operation in the periods p47 to p49 in FIG. 7 is similar to that in the periods p41 to p43 except that VR(3) is supplied to the RW[m+1, m+2] instead of VR(1). When VR(3) is supplied to the RW[m+1, m+2], the transistor 490 is turned on in the case where any of the second to fourth states is stored in the selected memory cell and remains off in the other cases. Since the selected memory cell connected to the bit line BL[n] stores the third state, the transistor 490 therein is brought into an on state. Since the selected memory cell connected to the bit line BL[n+1] stores the second state, the transistor 490 therein is on. As a result, in the period p45, the potential of the bit line BL[n] changes from $V_{precharge}$ to VS_0. The potential of the bit line BL[n+1] changes from $V_{precharge}$ to V0.

By data reading in the periods p31 to p39 and p41 to p49, data stored in the memory cell array illustrated in FIG. 5 is read. In the read circuit, it is assumed that the bit line potential higher than Vref is "1" and the bit line potential lower than Vref is "0". According to the timing chart of FIG. 7, the read circuit connected to the bit line BL[n] reads "0", "0", "0", "1", "0", "0". The first three values indicate that the selected memory cell stores the fourth state, and the last three values indicate that the selected memory cell stores the third state. The read circuit connected to the bit line BL[n+1] reads "1", "1", "1", "1", "1", "0". The first three values indicate that the selected memory cell stores the first state, and the last three values indicate that the selected memory cell stores the second state.

The reading operation is performed by detecting the conduction state of the transistor 490 in the focusing memory cell. In the memory cell array illustrated in FIG. 5, when the selection word line SW is selected, the transistors 490_1 in two memory cells per bit line are turned on at the same time. That is, the selection word line SW selects two memory cells per bit line. The read word line RW is also connected to two memory cells per bit line. However, the two memory cells selected by the selection word line SW are connected to different read word lines RW. Thus, reading from only one of the two memory cells is possible by using the read word line RW, In the above-described manner, writing and reading of four kinds of potentials V1, V2, V3, and V4 (V1<V2<V3<V4) can be performed on the selected memory cells in the memory cell array illustrated in FIG. 5. That is, a multilevel (4-level) memory cell is achieved. One embodiment of the present invention is not limited to this example, and the number of levels the memory cell can store can be varied. For example, 2- to 256-multilevel memory cells may be achieved.

Other than the memory cell illustrated in FIG. 1, the configuration of the memory cell that is not provided with the selection word line SW is possible, in which case operation is possible by not selecting the memory cell by the use of the read word line RW. As compared with such a memory cell, the semiconductor device (memory cell) of one embodiment of the present invention illustrated in FIG. 1 with almost the same area size can have smaller operating power. With the configuration of the memory cell array illustrated in FIG. 5, an arbitrary memory cell that does not share the selection word line SW with the selected memory cell can be unselected by the use of the selection word line SW. Unselecting the memory cell by the use of the selection word line SW consumes less power than unselecting the memory cell by the use of the read word line RW. This is because the conduction state of the transistor 490_23 depends on the potential of the floating node while the conduction state of the transistor 490_1 is not influenced by the potential of the floating node; therefore, the absolute value of the potential of the second gate electrode that makes the transistor 490_23 in a non-conducting state is often larger than the absolute value of the potential of the first gate electrode that makes the transistor 490_1 in a non-conducting state. Accordingly, with the configuration of the memory cell array illustrated in FIG. 5, operating power can be reduced. Furthermore, even if the conductor 421b having a function of the selection word line SW is not provided in the memory cell illustrated in FIG. 3, the area of the memory cell is hardly reduced because, when seen from the above, the conductor 427 that is the gate electrode of the transistor 491 is positioned between the conductor 426 that is the third gate electrode of the transistor 490 and the conductor 416b that is the other of the source electrode and the drain electrode of the transistor 490. The number of signal lines per memory cell is as follows: 1 bit line BL, 1 write word line WW, approximately 0.5 read word lines RW, and approximately 0.5 selection word lines SW; approximately 3 lines in total. Thus, the memory cell area in the configuration of the memory cell array illustrated in FIG. 5 can be the same as that in the configuration of the memory cell that is not provided with the selection word line.

In the memory cell array in which a plurality of memory cells with the configuration illustrated in FIG. 1 are arranged, by connecting different read word lines RW to different memory cells connected to one bit line, an arbitrary memory cell can be unselected by the use of the read word lines RW. In this case, even when the potential of the selection word lines SW is fixed at VS_H, the memory cells can be operated. However, the number of read word lines RW is approximately twice that of the memory cell array illustrated in FIG. 5. In the memory cell array in which a plurality of memory cells with the configuration illustrated in FIG. 1 are arranged, by connecting different selection word lines SW to different memory cells connected to one bit line, an arbitrary memory cell can be unselected by the use of the selection word lines SW. In this case, even when the potential of the read word line RW for the unselected memory cell is not the potential VR_L but the potential VR_0, the memory cells can be operated. However, the number of selection word lines SW is approximately twice that of the memory cell array illustrated in FIG. 5.

Using the above-described semiconductor device (memory cell), a memory cell with reduced area can be achieved. Accordingly, a semiconductor device with improved storage density or improved storage capacity can be provided.

Embodiment 2

An example of the configuration of a semiconductor device of one embodiment of the present invention will be described with reference to FIG. 8.

Figure 8:
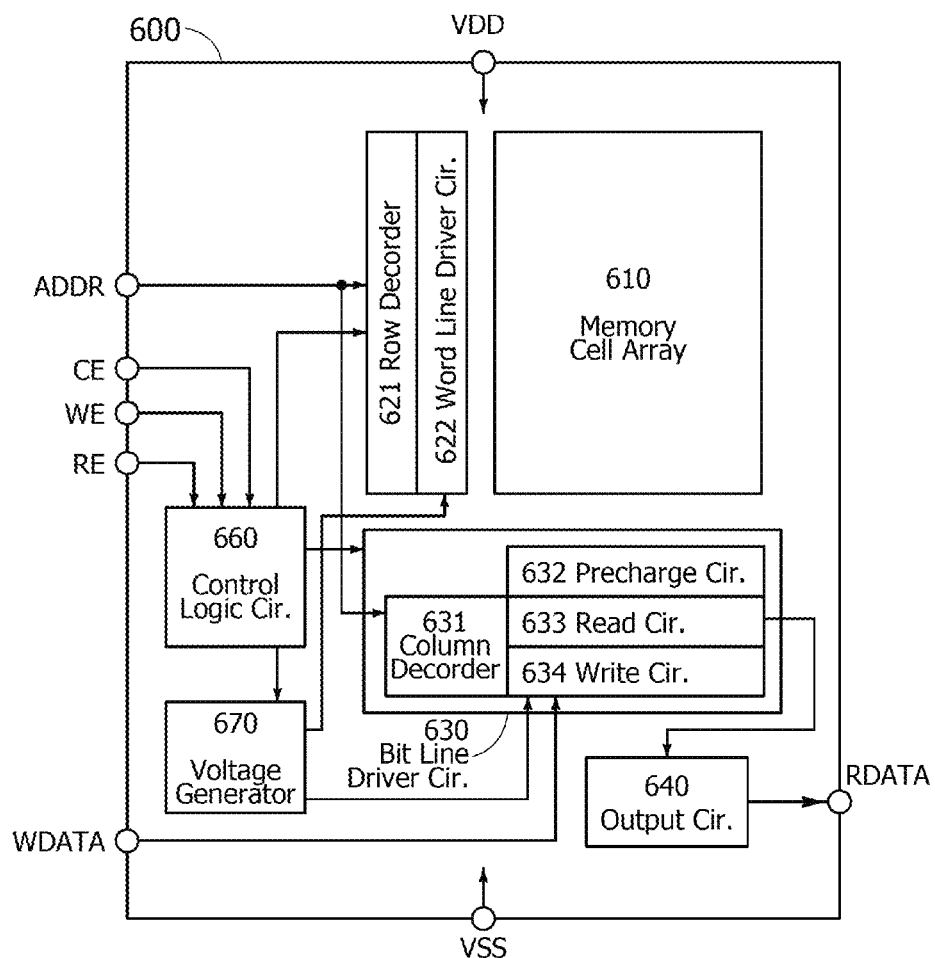
FIG. 8 is a block diagram of a memory device.

FIG. 8 illustrates a configuration example of a semiconductor device. A semiconductor device 600 illustrated in FIG. 8 is an example of a semiconductor device that can function as a memory device. The semiconductor device 600 includes a memory cell array 610, a row decoder 621, a word line driver circuit 622, a bit line driver circuit 630, an output circuit 640, a control logic circuit 660, and a power supply circuit 670.

The memory cell array 610 has the configuration illustrated in FIG. 5, for example. The bit line driver circuit 630 includes a column decoder 631, a precharge circuit 632, a read circuit 633, and a write circuit 634. The precharge circuit 632 has a function of precharging bit lines. The read circuit 633 has a function of detecting potentials of the bit lines and reading data from memory cells. The read signals are output outside the semiconductor device 600 as digital data signals RDATA, through the output circuit 640.

To the semiconductor device 600, a low power supply voltage (VSS), a high power supply voltage (VDD), and the like are supplied from the outside as power supply voltages.

In addition, control signals (CE, WE, RE), an address signal ADDR, a data signal WDATA, and the like are input to the semiconductor device 600 from the outside. ADDR is input to the row decoder 621 and the column decoder 631, and WDATA is input to the write circuit 634.

The control logic circuit 660 processes the signals (CE, WE, RE) input from the outside, and generates control signals and the like for the row decoder 621, the column decoder 631, and the power supply circuit 670. CE, WE, and RE are a chip enable signal, a write enable signal, and a read enable signal, respectively. Signals processed by the control logic circuit 660 are not limited to those listed above, and other control signals may be input as necessary.

The read circuit 633 may include a sense amplifier in which the potential Vref and the bit line potential may be compared. Furthermore, the read circuit 633 may include a logic circuit for converting the read data into the output format. The write circuit 634 may include a logic circuit for converting the input data WDATA into the writing format.

VDD, VSS, or another power supply voltage is input to the power supply circuit 670, and the power supply circuit 670 generates and outputs potentials necessary for reading operation and writing operation. For example, in the case of performing writing and reading of the above-described 4-level memory cell, V1, V2, V3, V4, VW_H, VW_L, VR_L, VR(1), VR(2), VR(3), and the like may be generated.

Note that the decision whether the circuits and signals described above are used or not can be made as appropriate as needed.

By including the above-described memory cell, the semiconductor device 600 can include a memory cell with reduced area, can have improved storage density, can have improved storage capacity, or can be small.

Note that the circuits other than the memory cell array 610 may include an n-channel Si transistor and a p-channel Si transistor. A region where a transistor including an oxide semiconductor is not used can be stacked below the memory cell array 610. This leads to a smaller memory device.

The circuits other than the memory cell array 610 may include a transistor including an oxide semiconductor and a p-channel Si transistor. Since the transistor including an oxide semiconductor has a low off-state current and a high on-state current, when the transistor including an oxide semiconductor is used in a CMOS circuit together with a p-channel Si transistor, both a low leakage current and high-speed operation can be achieved. In particular, in the case where transistors including an oxide semiconductor are used as all the n-channel transistors, the process can be simplified without the need for forming n-channel Si transistors, improving yield and reducing process cost.

This embodiment can be combined with any of the other embodiments described in this specification as appropriate.

Embodiment 3

The transistors 490 and 491 can have a variety of structures. In this embodiment, only the transistor 491 and the region in the vicinity thereof are illustrated in FIGS. 9A and 9B and FIGS. 10A and 10B for easy understanding.

Figure 9A:
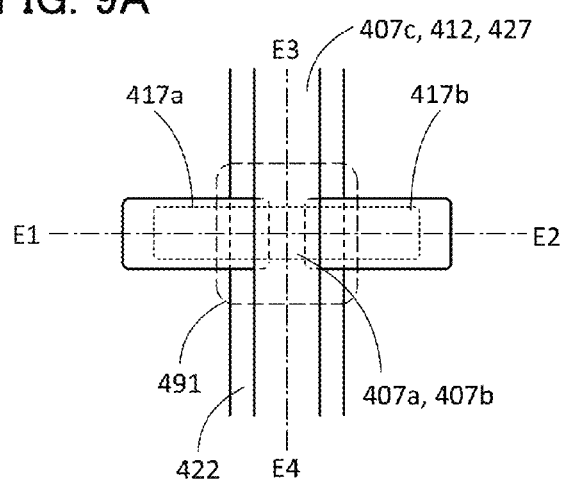
FIGS. 9A and 9B are a plan view and a cross-sectional view of a transistor.
Figure 9B:
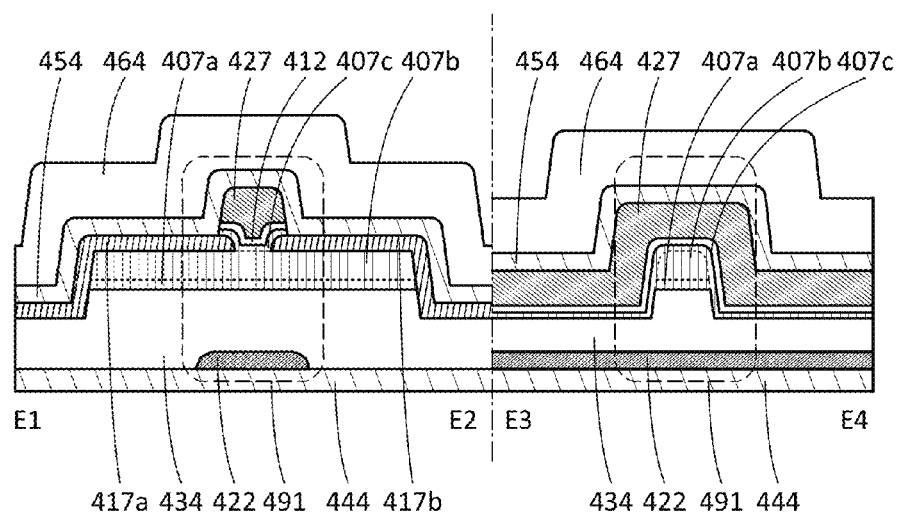

FIG. 9A is an example of a plan view of the transistor 491. FIG. 9B illustrates an example of a cross-sectional view taken along dashed-dotted line E1-E2 and dashed-dotted line E3-E4 in FIG. 9A. Note that some components such as an insulator are omitted in FIG. 9A for easy understanding.

Although FIG. 3 and the like illustrate an example where the conductor 417a and the conductor 417b which function as the source electrode and the drain electrode are in contact with only the top surface of the semiconductor 407b, the transistor structure of one embodiment of the present invention is not limited thereto. For example, as illustrated in FIGS. 9A and 9B, the conductor 417a and the conductor 417b may be in contact with top and side surfaces of the semiconductor 407b, a top surface of the insulator 434, and the like.

Like the transistor having the structure illustrated in FIG. 3, the transistor having the structure illustrated in FIGS. 9A and 9B has the structure in which the conductor 427 electrically surrounds the semiconductor 407b in the channel width direction and the side surfaces as well as the top surface of the semiconductor 407b are surrounded. This is the s-channel structure. For the s-channel structure, the description of FIG. 3 can be referred to. With the s-channel structure, excellent characteristics such as a high on-state current, a high field-effect mobility, a low subthreshold swing, and high reliability can be achieved.

In the transistor having the structure illustrated in FIGS. 9A and 9B, the conductors 417a and 417b are in contact with side surfaces of the semiconductor 407a and the top and side surfaces of the semiconductor 407b. In addition, the semiconductor 407c is in contact with side surfaces of the semiconductor 407a, top and side surfaces of the semiconductor 407b, top and side surfaces of the conductor 417a, and top and side surfaces of the conductor 417b.

In the semiconductor 407b that is in contact with the conductors 417a and 417b, hydrogen enters oxygen vacancy sites in some cases to form donor levels; thus the semiconductor 407b includes an n-channel conductive region. A state in which hydrogen enters oxygen vacancy sites is denoted by VoH in some cases. Because of current flow in the n-channel conductive region, a high on-state current can be obtained.

Figure 10A:
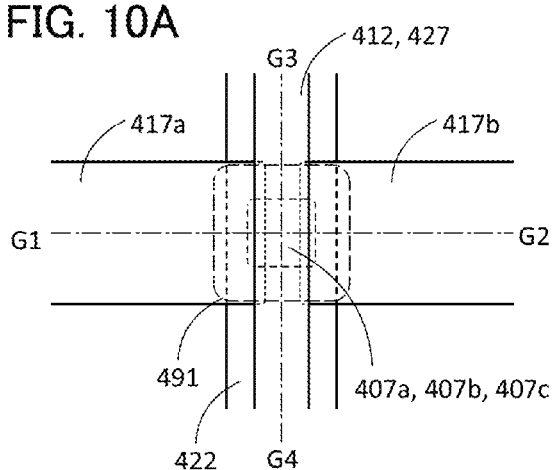
FIGS. 10A and 10B are a plan view and a cross-sectional view of a transistor.
Figure 10B:
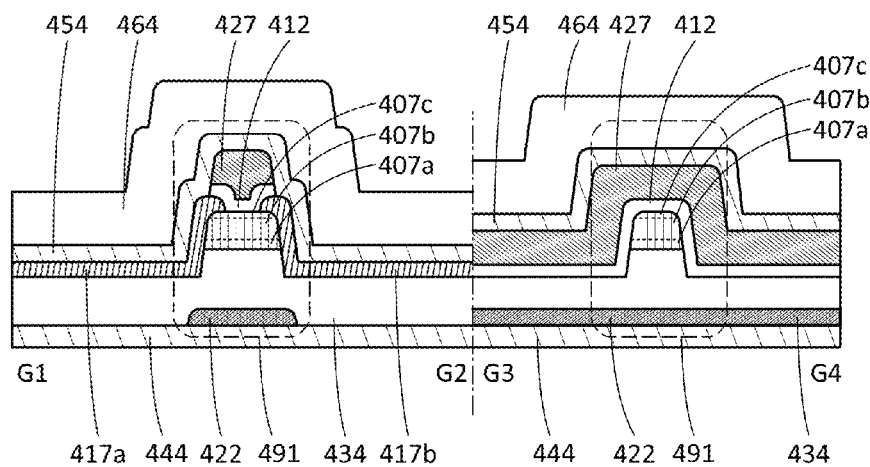

FIG. 10A is an example of a plan view of the transistor 491. FIG. 10B illustrates an example of a cross-sectional view taken along dashed-dotted line G1-G2 and dashed-dotted line G3-G4 in FIG. 10A. Note that some components such as an insulator are omitted in FIG. 10A for easy understanding.

The transistor 491 in FIGS. 10A and 10B includes a conductor 422 over the insulator 444, the insulator 434 having a projection over the insulator 444 and the conductor 422, the semiconductor 407a over the projection of the insulator 434, the semiconductor 407b over the semiconductor 407a, the semiconductor 407c over the semiconductor 407b, the conductors 417a and 417b being in contact with the semiconductors 407a, 407b, and 407c and arranged with a distance therebetween, the insulator 412 over the semiconductor 407c, the conductor 417a, and the conductor 417b, the conductor 427 over the insulator 412, the insulator 454 over the conductor 417a, the conductor 417b, the insulator 412, and the conductor 427, and the insulator 464 over the insulator 454.

Note that the insulator 412 is in contact with at least side surfaces of the semiconductor 407b in the cross section taken along line G3-G4. Furthermore, the conductor 427 faces top and side surfaces of the semiconductor 407b with at least the insulator 412 therebetween in the cross section taken along line G3-G4. Moreover, the conductor 422 faces a bottom surface of the semiconductor 407b with the insulator 434 therebetween. The insulator 434 without the projection is acceptable. Furthermore, the semiconductor 407c, the insulator 454, and the insulator 464 may be omitted.

The structure of the transistor 491 illustrated in FIGS. 10A and 10B is partly different from that of the transistor 491 in FIG. 3. Specifically, the transistor 491 in FIGS. 10A and 10B is different from that in FIG. 3 in the structures of the semiconductors 407a, 407b, and 407c in the transistor 491 and in whether the conductor 422 is provided. Thus, for the transistor in FIGS. 10A and 10B, the description of the transistor in FIG. 3 can be referred to as appropriate.

Embodiment 4

The structures of an oxide semiconductor that can be used for the semiconductors 406a, 406b, 406c, 407a, 407b, and 407c and the like will be described below. In this specification, the trigonal and rhombohedral crystal systems are included in the hexagonal crystal system.

An oxide semiconductor is classified roughly into a single crystal oxide semiconductor and a non-single-crystal oxide semiconductor. The non-single-crystal oxide semiconductor includes any of a c-axis aligned crystalline oxide semiconductor (CAAC-OS), a polycrystalline oxide semiconductor, a microcrystalline oxide semiconductor, an amorphous oxide semiconductor, and the like.

First, a CAAC-OS will be described.

The CAAC-OS is one of oxide semiconductors having a plurality of c-axis aligned crystal parts.

With a transmission electron microscope (TEM), a combined analysis image (also referred to as a high-resolution TEM image) of a bright-field image and a diffraction pattern of the CAAC-OS is observed. Consequently, a plurality of crystal parts are observed clearly. However, in the high-resolution TEM image, a boundary between crystal parts, that is, a grain boundary is not clearly observed. Thus, in the CAAC-OS, a reduction in electron mobility due to the grain boundary is less likely to occur.

According to the high-resolution cross-sectional TEM image of the CAAC-OS observed in a direction substantially parallel to the sample surface, metal atoms are arranged in a layered manner in the crystal parts. Each metal atom layer has a morphology reflecting a surface over which the CAAC-OS is formed (hereinafter, a surface over which the CAAC-OS is formed is referred to as a formation surface) or a top surface of the CAAC-OS, and is arranged parallel to the formation surface or the top surface of the CAAC-OS.

In the high-resolution plan-view TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts.

FIG. 11A is a high-resolution cross-sectional TEM image of a CAAC-OS. FIG. 11B is a high-resolution cross-sectional TEM image obtained by enlarging the image of FIG. 11A. In FIG. 11B, atomic arrangement is highlighted for easy understanding.

FIG. 11C is local Fourier transform images of regions each surrounded by a circle (the diameter is about 4 nm) between A and O and between O and A' in FIG. 11A. C-axis alignment can be observed in each region in FIG. 11C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS, spots are observed (see FIG. 12A).

From the results of the high-resolution cross-sectional TEM image and the high-resolution plan-view TEM image, alignment is found in the crystal parts in the CAAC-OS.

Most of the crystal parts included in the CAAC-OS each fit inside a cube whose one side is less than 100 nm. Thus, there is a case where a crystal part included in the CAAC-OS fits inside a cube whose one side is less than 10 nm, less than 5 nm, or less than 3 nm. Note that when a plurality of crystal parts included in the CAAC-OS are connected to each other, one large crystal region is formed in some cases. For example, a crystal region with an area of 2500 $nm^2$ or more, 5 $\mu m^2$ or more, or 1000 $\mu m^2$ or more is observed in some cases in the high-resolution plan-view TEM image.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

On the other hand, when the CAAC-OS is analyzed by an in-plane method in which an X-ray is incident on a sample in a direction substantially perpendicular to the c-axis, a peak appears frequently when 2θ Bis around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor of $InGaZnO_4$, six peaks appear. The six peaks are derived from crystal planes equivalent to the (110) plane. In the case of a CAAC-OS, a peak is not clearly observed even when φ scan is performed with 2θ fixed at around 56°.

According to the above results, in the CAAC-OS having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS is changed by etching or the like, the c-axis might not be necessarily parallel to a normal vector of a formation surface or a normal vector of a top surface of the CAAC-OS.

Distribution of c-axis aligned crystal parts in the CAAC-OS is not necessarily uniform. For example, in the case where crystal growth leading to the crystal parts of the CAAC-OS occurs from the vicinity of the top surface of the, the proportion of the c-axis aligned crystal parts in the vicinity of the top surface is higher than that in the vicinity of the formation surface in some cases. Further, when an impurity is added to the CAAC-OS, a region to which the impurity is added may be altered and the proportion of the c-axis aligned crystal parts in the CAAC-OS might vary depending on regions.

Note that when the CAAC-OS with an $InGaZnO_4$ crystal is analyzed by an out-of-plane method, a peak may also be observed when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS, a peak appear when $2\theta$ is around 31° and that a peak not appear when $2\theta$ is around 36°.

The CAAC-OS is an oxide semiconductor having low impurity concentration. The impurity is an element other than the main components of the oxide semiconductor, such as hydrogen, carbon, silicon, or a transition metal element. In particular, an element that has higher bonding strength to oxygen than a metal element included in the oxide semiconductor, such as silicon, disturbs the atomic arrangement of the oxide semiconductor by depriving the oxide semiconductor of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor and causes a decrease in crystallinity when it is contained in the oxide semiconductor. Note that the impurity contained in the oxide semiconductor might serve as a carrier trap or a carrier generation source.

The CAAC-OS is an oxide semiconductor having a low density of defect states. In some cases, oxygen vacancies in the oxide semiconductor serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Therefore, a transistor including the oxide semiconductor rarely has negative threshold voltage (is rarely normally on). The highly purified intrinsic or substantially highly purified intrinsic oxide semiconductor has a low density of defect states, and thus has few carrier traps. Accordingly, the transistor including the oxide semiconductor has little variation in electrical characteristics and high reliability. Electric charge trapped by the carrier traps in the oxide semiconductor takes a long time to be released and might behave like fixed electric charge. Thus, the transistor including the oxide semiconductor having high impurity concentration and a high density of defect states has unstable electrical characteristics in some cases.

With the use of the CAAC-OS in a transistor, variation in the electrical characteristics of the transistor due to irradiation with visible light or ultraviolet light is small.

Next, a microcrystalline oxide semiconductor is described.

A microcrystalline oxide semiconductor has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor including nanocrystal is referred to as an nc-OS (nanocrystalline oxide semiconductor). In a high resolution TEM image of the nc-OS, a grain boundary cannot be found clearly in the nc-OS sometimes for example.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS. Thus, the orientation of the whole film is not observed. Accordingly, in some cases, the nc-OS cannot be distinguished from an amorphous oxide semiconductor depending on an analysis method. For example, when the nc-OS is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS obtained by using an electron beam having a probe diameter (e.g., larger than or equal to 50 nm) larger than the diameter of a crystal part. Meanwhile, spots are shown in a nanobeam electron diffraction pattern of the nc-OS obtained by using an electron beam having a probe diameter close to, or smaller than the diameter of a crystal part. In a nanobeam electron diffraction pattern of the nc-OS, regions with high luminance in a circular (ring) pattern are shown in some cases. Furthermore, in a nanobeam electron diffraction pattern of the nc-OS, a plurality of circumferentially distributed spots are observed in some cases (see FIG. 12B).

The nc-OS is an oxide semiconductor that has high regularity as compared to an amorphous oxide semiconductor. Thus, the nc-OS has a lower density of defect states than an amorphous oxide semiconductor. Note that there is no regularity of crystal orientation between different crystal parts in the nc-OS. Hence, the nc-OS has a higher density of defect states than the CAAC-OS.

Thus, the nc-OS may have a higher carrier density than the CAAC-OS. The oxide semiconductor having a high carrier density may have high electron mobility. Thus, a transistor including the nc-OS may have high field-effect mobility. The nc-OS has a higher defect state density than the CAAC-OS, and thus may have a lot of carrier traps. Consequently, a transistor including the nc-OS has larger changes in electrical characteristics and lower reliability than a transistor including the CAAC-OS. The nc-OS can be formed easily as compared to the CAAC-OS because nc-OS can be formed even when a relatively large amount of impurities are included; thus, depending on the purpose, the nc-OS can be favorably used in some cases. Thus, a semiconductor device including the transistor including the nc-OS can be manufactured with high productivity in some cases.

Next, an amorphous oxide semiconductor is described.

The amorphous oxide semiconductor has disordered atomic arrangement and no crystal part. For example, the amorphous oxide semiconductor does not have a specific state as in quartz.

In the high-resolution TEM image of the amorphous oxide semiconductor, crystal parts cannot be found.

When the amorphous oxide semiconductor is subjected to structural analysis by an out-of-plane method with an XRD apparatus, a peak showing a crystal plane does not appear. A halo pattern is shown in an electron diffraction pattern of the amorphous oxide semiconductor. Furthermore, a halo pattern is shown but a spot is not shown in a nanobeam electron diffraction pattern of the amorphous oxide semiconductor.

Note that an oxide semiconductor may have a structure having physical properties between the nc-OS and the amorphous oxide semiconductor. The oxide semiconductor having such a structure is specifically referred to as an amorphous-like oxide semiconductor (amorphous-like OS).

In a high-resolution TEM image of the amorphous-like OS, a void may be seen. Furthermore, in the high-resolution TEM image, there are a region where a crystal part is clearly observed and a region where a crystal part is not observed. In the amorphous-like OS, crystallization by a slight amount of electron beam used for TEM observation occurs and growth of the crystal part is found sometimes. In contrast, crystallization by a slight amount of electron beam used for TEM observation is less observed in the nc-OS having good quality.

Note that the crystal part size in the amorphous-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the distance between the adjacent layers is equivalent to the lattice spacing on the (009) plane (also referred to as d value). The value is calculated to be 0.29 nm from crystal structural analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image. The maximum length in the region in which the lattice fringes are observed is regarded as the size of the crystal parts of the amorphous-like OS and the nc-OS. Note that the crystal part whose size is 0.8 nm or larger is selectively evaluated.

Figure 19:
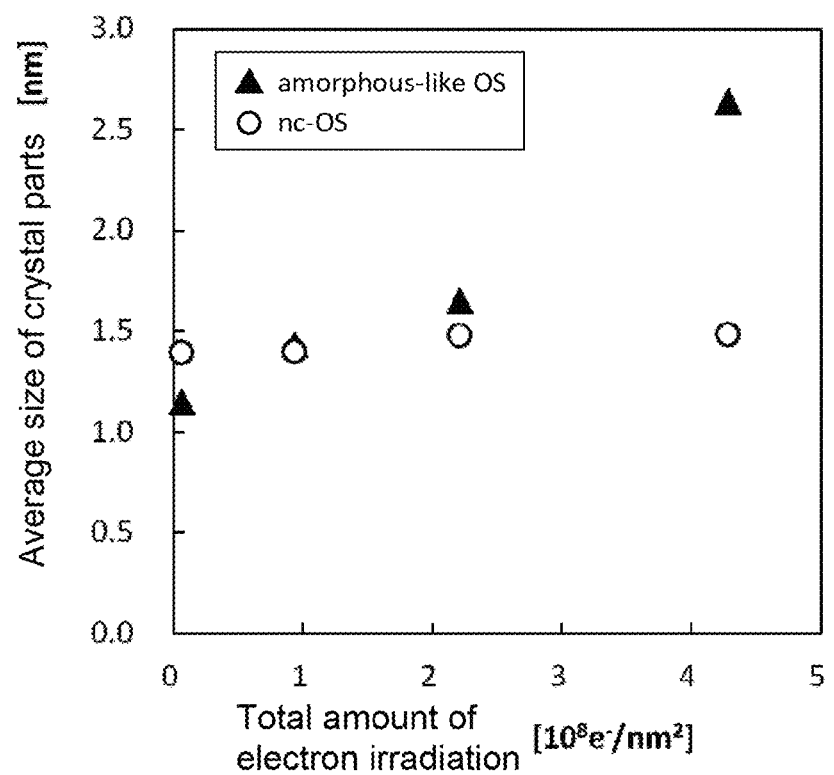
FIG. 19 shows a change in crystal parts by electron beam irradiation.

FIG. 19 shows examination results of change in average size of crystal parts (20-40 points) in the amorphous-like OS and the nc-OS using the high-resolution TEM images. As in FIG. 19, the crystal part size in the amorphous-like OS increases with an increase of the total amount of electron irradiation. Specifically, the crystal part of approximately 1.2 nm at the start of TEM observation grows to a size of approximately 2.6 nm at the total amount of electron irradiation of $4.2 \times 10^8 e^-/nm^2$. In contrast, the crystal part size in the good-quality nc-OS shows little change from the start of electron irradiation to the total amount of electron irradiation of $4.2 \times 10^8 e^-/nm^2$ regardless of the amount of electron irradiation.

Furthermore, in FIG. 19, by linear approximation of the change in the crystal part size in the amorphous-like OS and the nc-OS and extrapolation to the total amount of electron irradiation of $0 e^-/nm^2$, the average size of the crystal part is found to be a positive value. This means that the crystal parts exist in the amorphous-like OS and the nc-OS before TEM observation.

Note that an oxide semiconductor may be a stacked-layer including two or more of an amorphous oxide semiconductor, a microcrystalline oxide semiconductor, and a CAAC-OS, for example.

In the case where an oxide semiconductor has a plurality of structures, the structures can be analyzed using nanobeam electron diffraction in some cases.

Figure 12A:
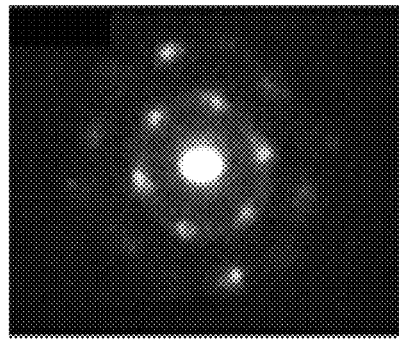
FIGS. 12A and 12B show nanobeam electron diffraction patterns of oxide semiconductors.
Figure 12B:
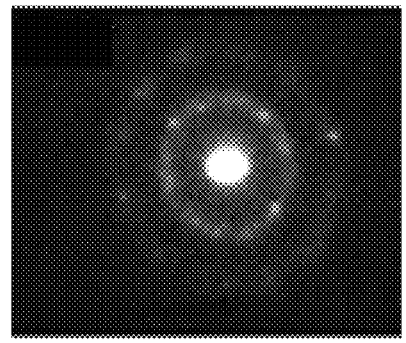
Figure 12C:
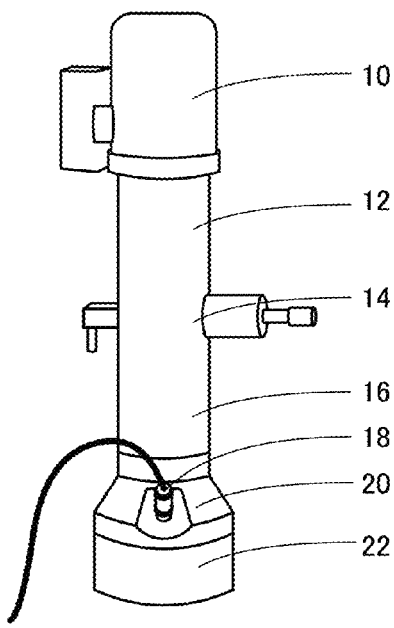
FIGS. 12C and 12D illustrate an example of a transmission electron diffraction measurement apparatus.

FIG. 12C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 12D:
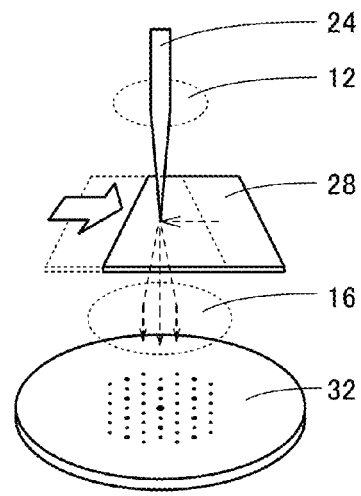

FIG. 12D illustrates an internal structure of the transmission electron diffraction measurement apparatus illustrated in FIG. 12C. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 are incident on a fluorescent plate 32 provided in the observation chamber 20 through the optical system 16. On the fluorescent plate 32, a pattern corresponding to the intensity of the incident electrons appears, which allows measurement of a transmission electron diffraction pattern.

The camera 18 is installed so as to face the fluorescent plate 32 and can take an image of a pattern appearing on the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above will be described.

For example, changes in the structure of a substance can be observed by changing the irradiation position of the electrons 24 that are a nanobeam on the substance (or by scanning) as illustrated in FIG. 12D. At this time, when the substance 28 is a CAAC-OS, a diffraction pattern shown in FIG. 12A is observed. When the substance 28 is an nc-OS, a diffraction pattern shown in FIG. 12B is observed.

Even when the substance 28 is a CAAC-OS, a diffraction pattern similar to that of an nc-OS or the like is partly observed in some cases. Therefore, whether a CAAC-OS is favorable can be determined by the proportion of a region where a diffraction pattern of a CAAC-OS is observed in a predetermined area (also referred to as proportion of CAAC). In the case of a high-quality CAAC-OS, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS is observed in a certain area is referred to as the proportion of non-CAAC.

As an example, a sample including a CAAC-OS obtained just after deposition (represented as "as-sputtered") and a sample including a CAAC-OS subjected to heat treatment at 450° C. in an atmosphere containing oxygen were made, and transmission electron diffraction patterns were obtained by scanning top surfaces of the samples. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 13A:
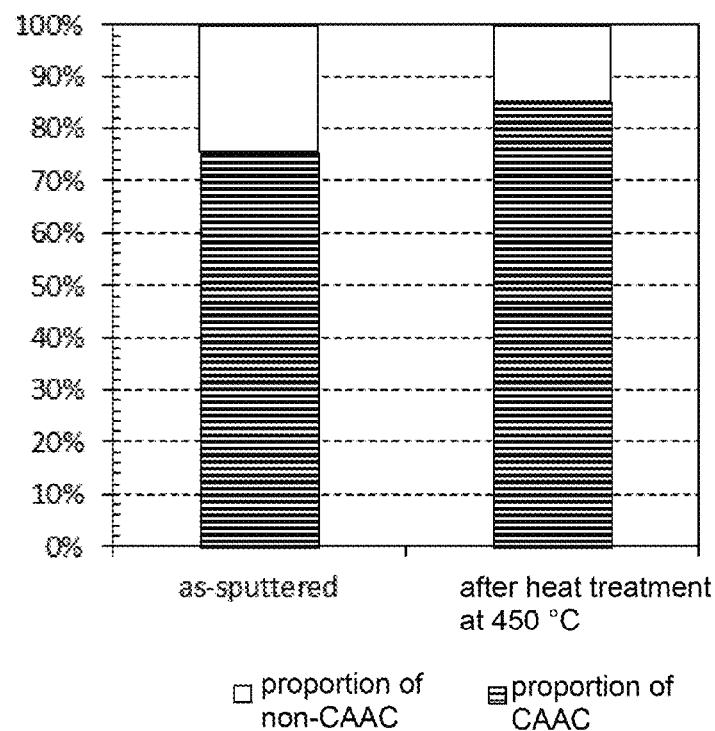
FIG. 13A shows an example of structural analysis by transmission electron diffraction measurement and FIGS. 13B and 13C show plan-view TEM images.

FIG. 13A shows the proportion of CAAC in each sample. The proportion of CAAC of the CAAC-OS obtained just after the deposition was 75.7% (the proportion of non-CAAC was 24.3%). The proportion of CAAC of the CAAC-OS subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS can have a high proportion of CAAC.

Here, most of diffraction patterns different from that of a CAAC-OS are diffraction patterns similar to that of an nc-OS. Furthermore, an amorphous oxide semiconductor was not able to be observed in the measurement region. Therefore, the above results suggest that the region having a structure similar to that of an nc-OS is rearranged by the heat treatment owing to the influence of the structure of the adjacent region, whereby the region becomes CAAC.

Figure 13B:
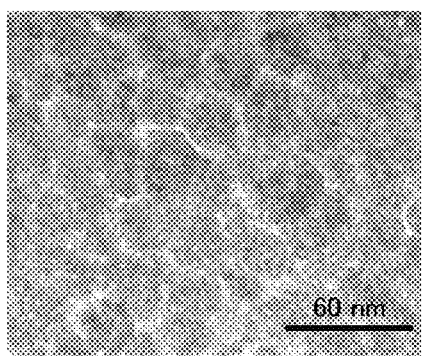
Figure 13C:
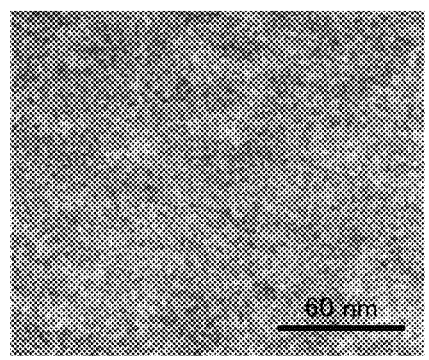

FIGS. 13B and 13C are high-resolution plan-view TEM images of the CAAC-OS obtained just after the deposition and the CAAC-OS subjected to the heat treatment at 450° C., respectively. Comparison between FIGS. 13B and 13C shows that the CAAC-OS subjected to the heat treatment at 450° C. has more uniform film quality. That is, the heat treatment at a high temperature improves the film quality of the CAAC-OS.

With such a measurement method, the structure of an oxide semiconductor having a plurality of structures can be analyzed in some cases.

The structures of the oxide semiconductor that can be used for the semiconductors 406a, 406b, 406c, 407a, 407b, and 407c and the like have been described so far.

Next, the other elements of the semiconductor that can be used for the semiconductors 406a, 406b, 406c, 407a, 407b, and 407c and the like are described. Although the semiconductors 406a, 406b, and 406c are typically described below, the same can apply to the semiconductors 407a, 407b, and 407c. Characteristics similar to those of the transistor 490 can be obtained from the transistor 491.

The oxide semiconductor that can be used for the semiconductor 406b is an oxide semiconductor containing indium, for example. An oxide semiconductor can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

Avalanche breakdown or the like is less likely to occur in some cases in the transistor including an oxide semiconductor than in a conventional transistor including silicon or the like, because, for example, an oxide semiconductor has a wide bandgap and thus electrons are less likely to be excited, and the effective mass of a hole is large. Therefore, it may be possible to inhibit hot-carrier degradation due to avalanche breakdown, for example. Accordingly, the drain withstand voltage can be increased, so that the transistor can be driven at a higher drain voltage. Thus, in some cases, a higher voltage, that is, more states can be held by a floating node, increasing storage density.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. In the case of using an In-M-Zn oxide as the semiconductor 406b, when the summation of In and M is assumed to be 100 atomic %, the proportions of In and M are preferably set to be greater than or equal to 25 atomic % and less than 75 atomic %, respectively, further preferably greater than or equal to 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. Note that the semiconductor 406c may be an oxide that is a type the same as that of the semiconductor 406a.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the bottom of the conduction band.

An indium gallium oxide has a small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

At this time, when an electric field is applied to a gate electrode, a channel is formed in the semiconductor 406b having the highest electron affinity in the semiconductors 406a, 406b, and 406c. Thus, the field effect mobility of the transistor can be increased. Here, the semiconductor 406b and the semiconductor 406c have the common constituent elements and thus interface scattering hardly occurs therebetween.

Figure 14A:
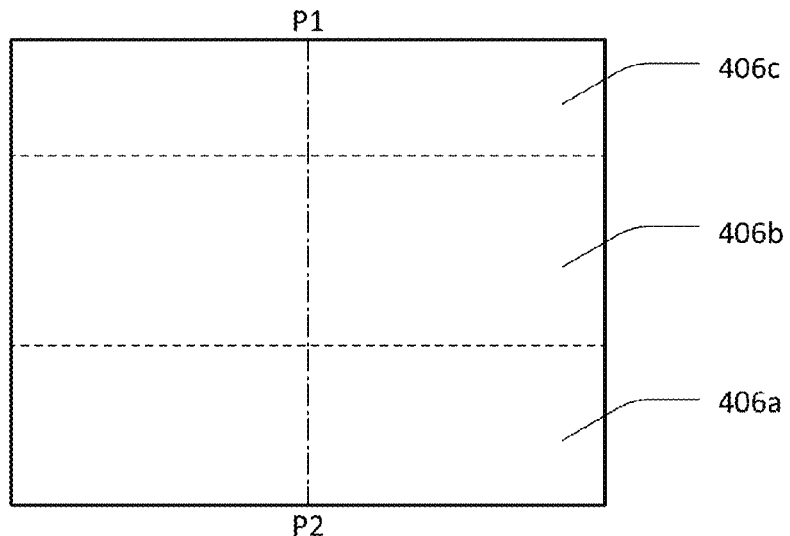
FIG. 14A is a cross-sectional view of stacked semiconductor layers and FIGS. 14B and 14C each show a band structure.
Figure 14B:
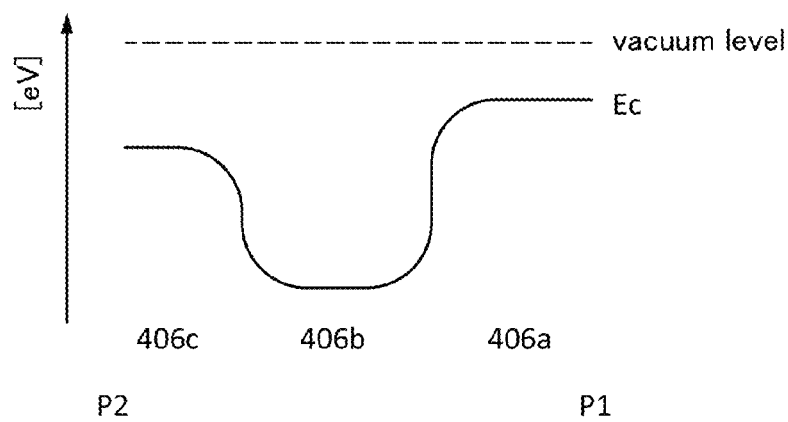
Figure 14C:
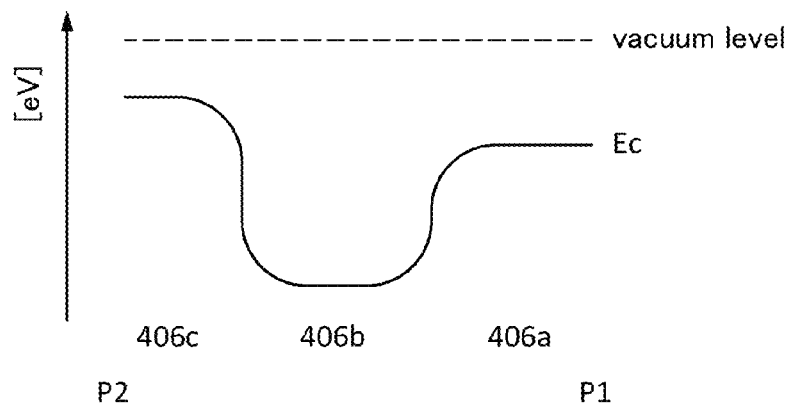

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low interface state density. For that reason, the stack of the semiconductor 406a, the semiconductor 406b, and the semiconductor 406c has a band diagram where energy at each interface and in the vicinity of the interface is changed continuously (continuous junction). Note that FIG. 14A is a cross-sectional view in which the semiconductor 406a, the semiconductor 406b, and the semiconductor 406c are stacked in this order. FIG. 14B shows energy (Ec) of the bottom of the conduction band corresponding to dashed-dotted line P1-P2 in FIG. 14A when the semiconductor 406c has a higher electron affinity than the semiconductor 406a. FIG. 14C shows the case where the semiconductor 406c has a lower electron affinity than the semiconductor 406a.

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-sate current of the transistor 490 can be increased.

For example, the semiconductor 406a and the semiconductor 406c include one or more elements other than oxygen included in the semiconductor 406b. Since the semiconductor 406a and the semiconductor 406c each include one or more elements other than oxygen included in the semiconductor 406b, an interface state is less likely to be formed at the interface between the semiconductor 406a and the semiconductor 406b and the interface between the semiconductor 406b and the semiconductor 406c.

Furthermore, the semiconductors 406a, 406b, and 406c preferably have no or a small amount of spinel crystal structures. Moreover, the semiconductors 406a, 406b, and 406c are preferably CAAC-OS.

For example, when a CAAC-OS having a plurality of c-axis aligned crystal parts is used as the semiconductor 406a, the semiconductor 406b formed thereover can have a region with favorable c-axis alignment even in the vicinity of the interface with the semiconductor 406a.

In addition, by an increase in the CAAC proportion of the CAAC-OS, defects can be reduced, for example. Furthermore, for example, an area having a spinel structure can be reduced. Moreover, for example, carrier scattering can be reduced. In addition, the CAAC-OS can be a film having a high blocking property against impurities. Accordingly, when the CAAC proportion of each of the semiconductors 406a and 406c is increased, a favorable interface with the semiconductor 406b where the channel is formed can be formed, so that carrier scattering can be low. For example, the CAAC proportion of the semiconductor 406a and/or the semiconductor 406c may be higher than or equal to 10%, preferably higher than or equal to 20%, further preferably higher than or equal to 50%, still further preferably higher than or equal to 70%. Furthermore, mixing of impurities to the semiconductor 406b can be prevented; as a result, the impurity concentration of the semiconductor 406b can be reduced.

The semiconductor 406b is preferably a semiconductor in which oxygen vacancies are reduced.

For example, in the case were the semiconductor 406b contains oxygen vacancies (also denoted by VO), donor levels are formed by entry of hydrogen into oxygen vacancy sites in some cases. A state in which hydrogen enters oxygen vacancy sites is denoted by VOH in the following description in some cases. VOH is a factor of decreasing the on-state current of the transistor 490 because VoH scatters electrons. Note that oxygen vacancy sites become more stable by entry of oxygen than by entry of hydrogen. Thus, by decreasing oxygen vacancies in the semiconductor 406b, the on-state current of the transistor 490 can be increased in some cases.

To decrease oxygen vacancies in the semiconductor 406b, for example, there is a method in which excess oxygen in the insulator 432 is moved to the semiconductor 406b through the semiconductor 406a. In this case, the semiconductor 406a is preferably a layer having an oxygen-transmitting property (a layer through which oxygen passes or is transmitted).

Oxygen is released from the insulator 432 and taken into the semiconductor 406a by heat treatment or the like. In some cases, oxygen exists and is apart from atomics in the semiconductor 406a, or exists and is bonded to oxygen or the like. As the density becomes lower, i.e., the number of spaces between the atoms becomes larger, the semiconductor 406a has a higher oxygen-transmitting property. For example, in the case where the semiconductor 406a has a layered crystal structure and oxygen movement in which oxygen crosses the layer is less likely to occur, the semiconductor 406a is preferably a layer having low crystallinity as appropriate.

The semiconductor 406a preferably has crystallinity such that excess oxygen (oxygen) is transmitted so that excess oxygen (oxygen) released from the insulator 432 reaches the semiconductor 406b. For example, in the case where the semiconductor 406a is a CAAC-OS, a structure in which a space is partly provided in the layer is preferably employed because when the whole layer becomes CAAC, excess oxygen (oxygen) cannot be transmitted. For example, the proportion of CAAC of the semiconductor 406a is lower than 100%, preferably lower than 98%, further preferably lower than 95%, still further preferably lower than 90%.

Moreover, the thickness of the semiconductor 406c is preferably as small as possible to increase the on-state current of the transistor 490. For example, the semiconductor 406c may include a region with a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. For example, the semiconductor 406c may include a region with a thickness of greater than or equal to 0.3 nm, preferably greater than or equal to 1 nm, further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a has a region with a thickness of, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, further preferably less than or equal to 80 nm.

For example, a region with a silicon concentration of lower than $1 \times 10^{19}$ atoms/cm$^3$, preferably lower than $5 \times 10^{18}$ atoms/cm$^3$, further preferably lower than $2 \times 10^{18}$ atoms/cm$^3$ which is measured by secondary ion mass spectrometry (SIMS) is provided between the semiconductor 406b and the semiconductor 406a. A region with a silicon concentration of lower than $1 \times 10^{19}$ atoms/cm$^3$, preferably lower than $5 \times 10^{18}$ atoms/cm$^3$, further preferably lower than $2 \times 10^{18}$ atoms/cm$^3$ which is measured by SIMS is provided between the semiconductor 406b and the semiconductor 406c.

It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The structures and the other elements of the oxide semiconductor that can be used for the semiconductors 406a, 406b, and 406c and the like have been described so far. By using the above-described oxide semiconductor in the semiconductors 406a, 406b, and 406c and the like, the transistor 490 can have favorable electrical characteristics. For example, excellent subthreshold characteristics and an extremely low off-state current can be achieved. Moreover, a high on-state current and favorable switching speed can be achieved. Furthermore, high withstand voltage can be achieved.

Embodiment 5

An example of the structure of a semiconductor device including the semiconductor device of one embodiment of the present invention will be described with reference to FIG. 15.

Figure 15:
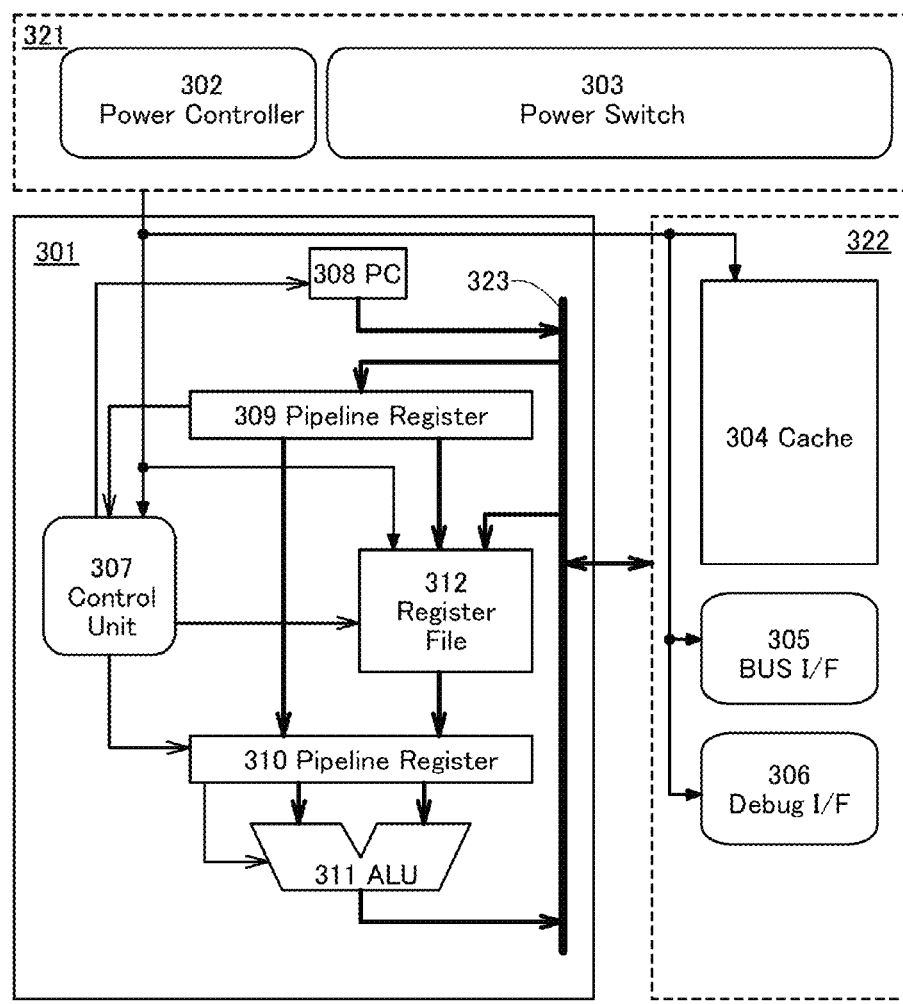
FIG. 15 is a block diagram illustrating a CPU of one embodiment of the present invention.

A semiconductor device 300 illustrated in FIG. 15 includes a CPU core 301, a power management unit 321, and a peripheral circuit 322. The power management unit 321 includes a power controller 302 and a power switch 303. The peripheral circuit 322 includes a cache 304 including cache memory, a bus interface (BUS I/F) 305, and a debug interface (Debug I/F) 306. The CPU core 301 includes a data bus 323, a control unit 307, a program counter (PC) 308, a pipeline register 309, a pipeline register 310, an arithmetic logic unit (ALU) 311, and a register file 312. Data is transmitted between the CPU core 301 and the peripheral circuit 322 such as the cache 304 via the data bus 323.

The semiconductor device of one embodiment of the present invention can be used in the cache 304, whereby the cache can have small size, high density, and large capacity. Thus, a miniaturized semiconductor device, a semiconductor device with larger storage capacity, a semiconductor device capable of higher-speed operation, or a semiconductor device with lower power consumption can be provided.

The control unit 307 has a function of controlling the timing of data transmission and reception between the PC 308, the pipeline register 309, the pipeline register 310, the ALU 311, the register file 312, and the outside of the CPU core 301 in accordance with fetched instructions or the like.

The ALU 311 has a function of performing a variety of arithmetic operations such as four arithmetic operations and logic operations.

The cache 304 has a function of temporarily storing frequently used data. The PC 308 is a register having a function of storing an address of an instruction to be executed next. Although not illustrated in FIG. 15, the cache 304 includes a cache controller for controlling the operation of the cache memory.

The pipeline register 309 has a function of temporarily storing fetched instructions.

The register file 312 includes a plurality of registers including a general purpose register and can retain data that is read from a main memory, data obtained as a result of arithmetic operations in the ALU 311, or the like.

The pipeline register 310 has a function of temporarily storing data used for arithmetic operations performed in the ALU 311, data obtained as a result of arithmetic operations in the ALU 311, or the like.

The bus interface 305 functions as a path for data between the semiconductor device 300 and devices outside the semiconductor device 300. The debug interface 306 functions as a control circuit for debugging the semiconductor device 300 or a path of a signal.

The power switch 303 has a function of controlling supply of the power supply voltage to circuits other than the power controller 302 in the semiconductor device 300. These circuits belong to several different power domains. The power switch 303 controls whether the power supply voltage is supplied to circuits in the same power domain. The power controller 302 has a function of controlling the operation of the power switch 303.

The semiconductor device 300 having the above-described configuration can perform power gating. An example of the flow of the power gating operation will be described.

First, the CPU core 301 sets the timing for stopping the supply of the power supply voltage in a register of the power controller 302. Next, an instruction to start power gating is sent from the CPU core 301 to the power controller 302. Then, the registers and the cache 304 in the semiconductor device 300 start data saving. Subsequently, the power switch 303 stops the supply of the power supply voltage to the circuits other than the power controller 302 in the semiconductor device 300. Then, an interrupt signal is input to the power controller 302, thereby starting the supply of the power supply voltage to the circuits included in the semiconductor device 300. Note that a counter may be provided in the power controller 302 to be used to determine the timing of starting the supply of the power supply voltage regardless of input of an interrupt signal. Next, the registers and the cache 304 start data restoration. After that, execution of an instruction is resumed in the control unit 307.

This power gating can be performed in the entire processor or one or more logic circuits included in the processor. The supply of power can be stopped even for a short time. Accordingly, power consumption can be reduced at a fine granularity in space or time.

In the case where the semiconductor device of one embodiment of the present invention is used in the cache 304, the cache 304 can hold data for a long time even when the supply of a power supply voltage is stopped. Thus, the cache 304 can keep holding data at the time of power gating and there is no need to store the data in a different place. As a result, power and time therefor are not required. In other words, in the case where not the semiconductor device of one embodiment of the present invention but a volatile SRAM is used in the cache 304, data in the cache needs to be erased or stored outside the semiconductor device 300 at the time of power gating. In the case where data is erased, the time and energy for taking data from the outside of the semiconductor device 300 (i.e., the time and energy necessary to warm up the cache) is required for restoration, while in the case of using the semiconductor device of one embodiment of the present invention, such time and energy are not required. In the case where data is stored outside the semiconductor device 300, the time and power necessary for storing and restoring data is required, while in the case of using the semiconductor device of one embodiment of the present invention, such time and power are not required.

Note that the semiconductor device of one embodiment of the present invention can be used for not only a CPU but also a graphics processing unit (GPU), a programmable logic device (PLD), a digital signal processor (DSP), a microcontroller unit (MCU), a radio frequency (RF) tag, a custom LSI, and the like.

Embodiment 6

An example of the configuration of a semiconductor device including the semiconductor device of one embodiment of the present invention will be described with reference to FIG. 16.

Figure 16:
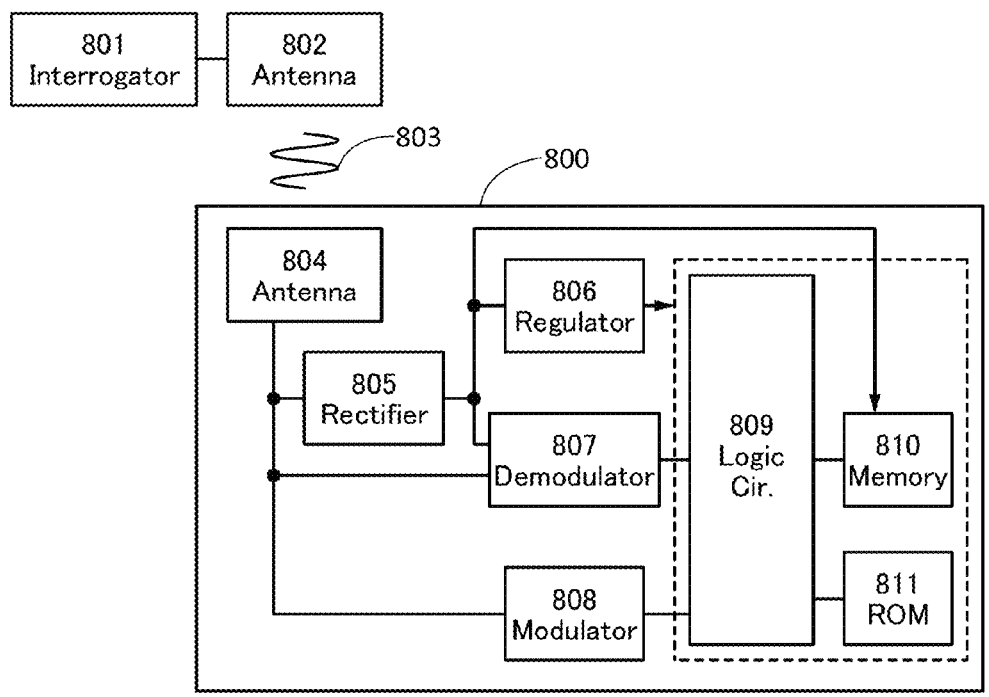
FIG. 16 is a block diagram showing an RF tag of one embodiment of the present invention.

A semiconductor device 800 illustrated in FIG. 16 is an example of the structure of an RF tag. The RF tag of this embodiment includes a memory circuit, stores necessary data in the memory circuit, and transmits and receives data to/from the outside with use of contactless means, for example, wireless communication. With these features, the RF tag can be used for an individual authentication system in which an object or the like is recognized by reading the individual information, for example.

The semiconductor device 800 illustrated in FIG. 16 includes an antenna 804, a rectifier circuit 805, a constant voltage circuit 806, a demodulation circuit 807, a modulation circuit 808, a logic circuit 809, a memory circuit 810, and a ROM 811.

The semiconductor device of one embodiment of the present invention can be used in the memory circuit 810, whereby the memory circuit 810 can have small size, high density, and large capacity. Thus, a miniaturized semiconductor device or a semiconductor device with larger storage capacity can be provided.

The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that as the data transmission method, there are an electromagnetic coupling method in which a pair of coils is provided so as to face each other and communicates with each other by mutual induction, an electromagnetic induction method in which communication is performed using an induction field, a radio wave method in which communication is performed using a radio wave, and the like. Any of these methods can be used in the semiconductor device 800 described in this embodiment.

Note that the decision whether each circuit described above is provided or not can be made as appropriate as needed.

In the circuits other than the memory circuit 810, transistors including an oxide semiconductor described in the above embodiment can be used as n-channel transistors. Since the transistors including an oxide semiconductor have low off-state currents and high on-state currents, both a low leakage current and high-speed operation can be achieved. Furthermore, the transistors including an oxide semiconductor described in the above embodiment may be used as elements having a rectifying function included in the demodulation circuit 807. Since the transistors have low off-state currents, the reverse currents of the elements having a rectifying function can be made low, leading to excellent rectification efficiency. Furthermore, since the transistors including an oxide semiconductor can be formed through the same process, high performance of the semiconductor device 800 can be achieved without an increase in process cost.

This embodiment can be combined with any of the other embodiments described in this specification as appropriate.

Embodiment 7

In this embodiment, application examples of the semiconductor device described in the foregoing embodiment to an electronic component and to an electronic device including the electronic component will be described with reference to FIGS. 17A and 17B and FIGS. 18A to 18F.

Figure 17A:
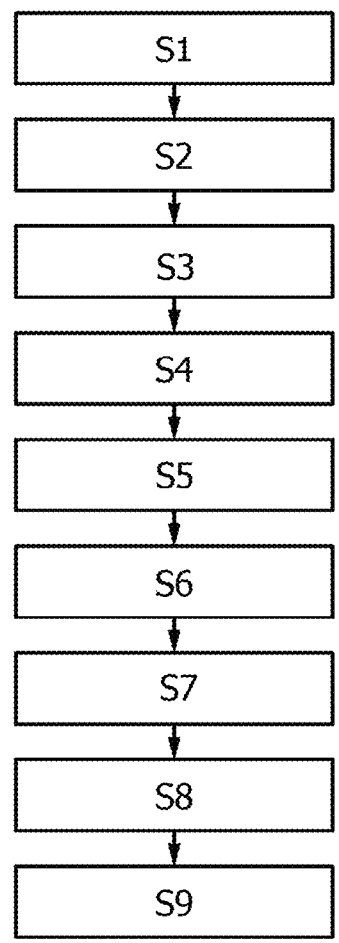
FIGS. 17A and 17B illustrate an electronic component of one embodiment of the present invention.

FIG. 17A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors described in FIG. 3 is completed by integrating detachable components on a printed circuit board through the assembly process (post-process).

The post-process can be completed through steps shown in FIG. 17A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The above-described electronic component can include the semiconductor device described in the above embodiment. Accordingly, an electronic component including the memory device with small size, high density, or large capacity can be achieved. The electronic component is an electronic component with small size and large storage capacity.

Figure 17B:
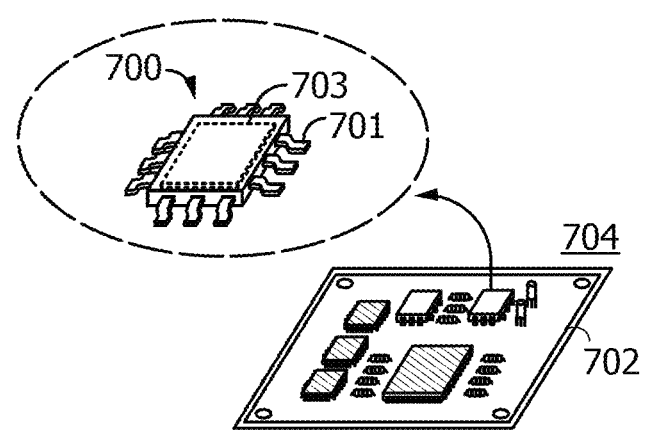

FIG. 17B is a schematic perspective diagram of a completed electronic component. FIG. 17B shows a schematic perspective diagram of a quad flat package (QFP) as an example of the electronic component. An electronic component 700 illustrated in FIG. 17B includes a lead 701 and a semiconductor device 703. The electronic component 700 in FIG. 17B is, for example, mounted on a printed circuit board 702. A plurality of electronic components 700 are used in combination and electrically connected to each other over the printed wiring board 702; thus, a substrate on which the electronic components are mounted (a circuit board 704) is completed. The completed circuit board 704 is provided in an electronic device or the like.

The above-described electronic component can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the above-described electronic component are mobile phones, game machines including portable game consoles, portable data terminals, e-book readers, cameras such as video cameras and digital still cameras, goggle-type display devices (head mounted displays), navigation systems, audio reproducing devices (e.g., car audio systems and digital audio players), copiers, facsimiles, printers, multifunction printers, automated teller machines (ATM), and vending machines. FIGS. 18A to 18F illustrate specific examples of these electronic devices.

Figure 18A:
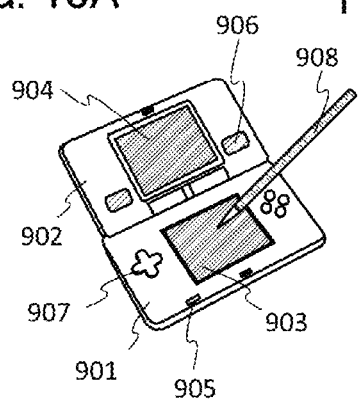
FIGS. 18A to 18F each illustrate an electronic device of one embodiment of the present invention.

FIG. 18A illustrates a portable game console including a housing 901, a housing 902, a display portion 903, a display portion 904, a microphone 905, a speaker 906, an operation key 907, a stylus 908, and the like. Although the portable game machine in FIG. 18A has the two display portions 903 and 904, the number of display portions included in a portable game machine is not limited to this.

Figure 18B:
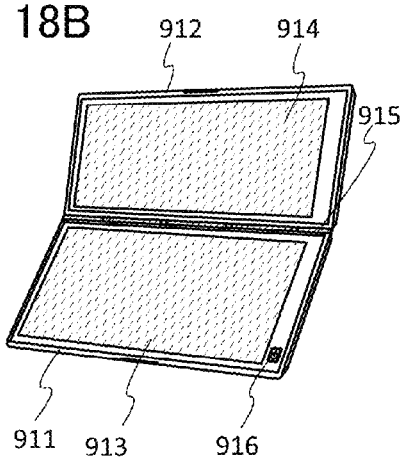

FIG. 18B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 18C:
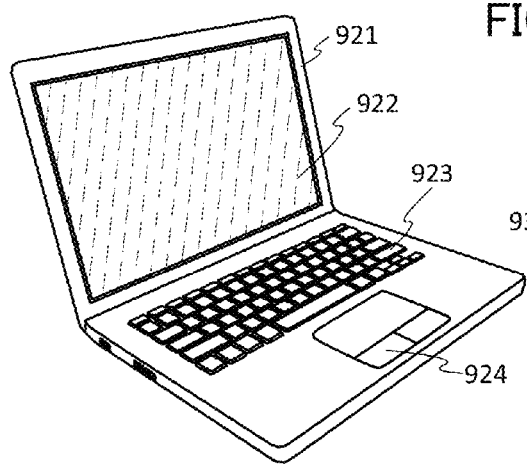

FIG. 18C illustrates a laptop personal computer, which includes a housing 921, a display portion 922, a keyboard 923, a pointing device 924, and the like.

Figure 18D:
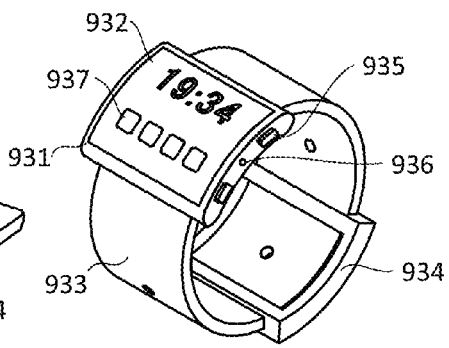

FIG. 18D illustrates an example of a wrist-watch-type information terminal, which includes a housing 931, a display portion 932, a band 933, a buckle 934, operation buttons 935, an input/output terminal 936, and the like. The information terminal is capable of executing a variety of applications such as mobile phone calls, e-mailing, reading and editing texts, music reproduction, Internet communication, and a computer game. The display surface of the display portion 932 is bent, and images can be displayed on the bent display surface. The display portion 932 includes a touch sensor, and operation control can be performed by touching the screen with a finger, a stylus, or the like. The information terminal can employ near field communication, which is a communication method based on an existing communication standard. Moreover, the information terminal includes the input output terminal 936, and data can be directly transmitted to and received from another information terminal via a connector.

Figure 18E:
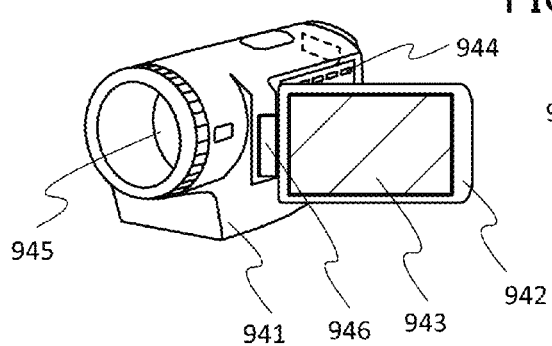

FIG. 18E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 18F:
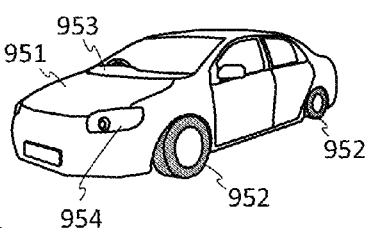

FIG. 18F illustrates an ordinary vehicle including a car body 951, wheels 952, a dashboard 953, lights 954, and the like.

By using an electronic component which includes a memory device with small size, high density, or large capacity including the semiconductor device (memory cell) of one embodiment of the present invention in these electronic devices, the electronic devices can have small sizes or high performance.

This embodiment can be combined with any of the other embodiments described in this specification as appropriate.
(Wording in the Specification and the Like)

In this specification and the like, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a line, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constructed. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

This application is based on Japanese Patent Application serial no. 2014-052211 filed with Japan Patent Office on Mar. 14, 2014, the entire contents of which are hereby incorporated by reference.

What is claimed is:
1. A semiconductor device comprising:
a first transistor; and
a second transistor,
wherein the first transistor comprises:
a first conductor;
a second conductor;
a first insulator over the first conductor and the second conductor;
a semiconductor over the first insulator;
a second insulator over the semiconductor;
a third conductor over the second insulator; and
a fourth conductor and a fifth conductor that are in contact with the semiconductor,
wherein the third conductor includes a first region not overlapping the first conductor,
wherein the third conductor includes a second region overlapping the second conductor with the semiconductor therebetween, and
wherein one of a source and a drain of the second transistor is electrically connected to the third conductor.

2. The semiconductor device according to claim 1, comprising a first memory cell and a second memory cell adjacent to each other,
wherein the first memory cell and the second memory cell each comprise:
the first transistor; and
the second transistor, and
wherein the first conductor included in the first memory cell is electrically connected to the first conductor included in the second memory cell.

3. The semiconductor device according to claim 1, comprising a first memory cell and a second memory cell adjacent to each other,
wherein the first memory cell and the second memory cell each comprise:
the first transistor; and
the second transistor, and
wherein the second conductor included in the first memory cell is electrically connected to the second conductor included in the second memory cell.

4. The semiconductor device according to claim 1, wherein the third conductor includes a region that does not overlap the second conductor.

5. The semiconductor device according to claim 1,
wherein the first conductor and the third conductor do not overlap with each other, and
wherein, when seen from the above, a distance between the first conductor and the third conductor is shorter than or equal to a distance between the first conductor and the second conductor.

6. The semiconductor device according to claim 1,
wherein the first conductor and the third conductor overlap with each other, and
wherein, when seen from the above, a width of a region where the first conductor and the third conductor overlap with each other is shorter than or equal to a distance between the first conductor and the second conductor.

7. The semiconductor device according to claim 1,
wherein the semiconductor is an oxide semiconductor, and
wherein a channel formation region of the second transistor includes an oxide semiconductor.

8. The semiconductor device according to claim 1, wherein the second transistor is stacked over the first transistor.

9. The semiconductor device according to claim 1, wherein any one state of 4 to 256 levels is held by the first transistor and the second transistor.

10. A radio-frequency tag comprising the semiconductor device according to claim 1, further comprising an antenna.

11. An electronic device comprising the semiconductor device according to claim 1, further comprising a printed wiring board.

12. A semiconductor device comprising:
a first transistor and a second transistor, the first transistor comprising:
- a first conductor;
- a second conductor;
- a first insulator over the first conductor and the second conductor;
- a semiconductor over the first insulator;
- a second insulator over the semiconductor;
- a third conductor over the second insulator; and
- a fourth conductor and a fifth conductor that are in contact with the semiconductor, wherein the semiconductor comprises a first region, a second region and a third region,
wherein the fourth conductor and the fifth conductor do not overlap the first region, second region and the third region,
wherein the first conductor overlaps the first region,
wherein the second conductor overlaps the second region,
wherein the third conductor overlaps the third region,
wherein the first region includes a region not overlapping the third region,
wherein the second region includes a region overlapping the third region, and
wherein one of a source and a drain of the second transistor is electrically connected to the third conductor of the first transistor.

13. The semiconductor device according to claim 12, comprising a first memory cell and a second memory cell adjacent to each other,
wherein the first memory cell and the second memory cell each comprise the first transistor and the second transistor, and
wherein the first conductor included in the first memory cell is electrically connected to the first conductor included in the second memory cell.

14. The semiconductor device comprising according to claim 12, comprising a first memory cell and a second memory cell adjacent to each other,
wherein the first memory cell and the second memory cell each comprise the first transistor and the second transistor, and
wherein the second conductor included in the first memory cell is electrically connected to the second conductor included in the second memory cell.

15. The semiconductor device according to claim 12, wherein the second region is included in the third region.

16. The semiconductor device according to claim 12,
wherein the first region and the third region do not overlap with each other, and
wherein a distance between the first region and the third region is shorter than or equal to a distance between the first region and the second region.

17. The semiconductor device according to claim 12,
wherein the first region and the third region overlap with each other, and
wherein a width of a region where the first region and the third region overlap with each other is shorter than or equal to a distance between the first region and the second region.

18. The semiconductor device according to claim 12, wherein an edge of the first region is aligned with an edge of the third region.

19. A radio-frequency tag comprising the semiconductor device according to claim 12, further comprising an antenna.

20. An electronic device comprising the semiconductor device according to claim 12, further comprising a printed wiring board.

* * * * *